US012802744B2

(12) United States Patent
Liu et al.

(10) Patent No.: US 12,802,744 B2
(45) Date of Patent: Nov. 17, 2026

(54) MEMORY DEVICE

(71) Applicant: Yangtze Memory Technologies Co., Ltd., Wuhan (CN)

(72) Inventors: Yaqin Liu, Wuhan (CN); Liang Chen, Wuhan (CN); Shiqi Huang, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 103 days.

(21) Appl. No.: 18/891,289

(22) Filed: Sep. 20, 2024

(65) Prior Publication Data

US 2025/0336437 A1 Oct. 30, 2025

(30) Foreign Application Priority Data

Apr. 29, 2024 (CN) ......................... 202410546500.9

(51) Int. Cl.

| | |
|---|---|
| ***G11C 11/408*** | (2006.01) |
| ***G11C 5/02*** | (2006.01) |
| ***G11C 5/06*** | (2006.01) |
| ***G11C 11/4091*** | (2006.01) |
| ***H10B 12/00*** | (2023.01) |

(52) U.S. Cl.

CPC .......... *G11C 11/4091* (2013.01); *G11C 5/025* (2013.01); *G11C 5/063* (2013.01); *G11C 11/4085* (2013.01); *G11C 11/4087* (2013.01); *H10B 12/312* (2023.02); *H10B 12/482* (2023.02); *H10B 12/485* (2023.02); *H10B 12/488* (2023.02); *H10B 12/50* (2023.02)

(58) Field of Classification Search

CPC ..... G11C 11/4091; G11C 5/025; G11C 5/063; G11C 11/4085; G11C 11/4087; H10B 12/482; H10B 12/485; H10B 12/50; H10B 12/312; H10B 12/488

USPC .................................................. 365/189.011

See application file for complete search history.

(56) References Cited

U.S. PATENT DOCUMENTS

| | | | | |
|---|---|---|---|---|
| 2015/0208510 A1* | 7/2015 | Pelley | H05K 1/181 361/736 |
| 2019/0238134 A1* | 8/2019 | Lee | H03K 19/1776 |
| 2019/0245543 A1* | 8/2019 | Lee | H03K 19/1776 |
| 2021/0313246 A1* | 10/2021 | Matsumura | H10W 42/00 |
| 2021/0375790 A1* | 12/2021 | Oda | H10W 42/00 |
| 2021/0375791 A1* | 12/2021 | Oda | H10W 42/00 |
| 2023/0060149 A1 | 3/2023 | Zhu et al. | |

(Continued)

*Primary Examiner* — Ly D Pham

(74) *Attorney, Agent, or Firm* — Hanley, Flight & Zimmerman, LLC

(57) ABSTRACT

Examples of the present application provide a memory device. The memory device includes: a first semiconductor structure including a memory cell array; a second semiconductor structure including at least a plurality of first control circuits and at least part of a peripheral circuit distributed at gaps of the plurality of first control circuits, wherein the first semiconductor structure and the second semiconductor structure are stacked and connected; a first interconnect layer located on a side of the second semiconductor structure that is away from the first semiconductor structure; and a plurality of connection structures penetrating through part of the second semiconductor structure, wherein one end of each connection structure is connected with the at least part of the peripheral circuit at the gaps, and the other end is connected with the first interconnect layer.

20 Claims, 37 Drawing Sheets

(56) References Cited

U.S. PATENT DOCUMENTS

| | | | |
|---|---|---|---|
| 2023/0062083 | A1 | 3/2023 | Zhu et al. |
| 2023/0062141 | A1 | 3/2023 | Zhu et al. |
| 2023/0062524 | A1 | 3/2023 | Liu et al. |
| 2023/0065806 | A1 | 3/2023 | Zhu et al. |
| 2023/0066312 | A1 | 3/2023 | Zhu et al. |
| 2024/0332232 | A1 | 10/2024 | Zhu et al. |
| 2024/0387428 | A1 | 11/2024 | Zhu et al. |

* cited by examiner

MEMORY DEVICE

CROSS-REFERENCE TO RELATED APPLICATIONS

This application claims priority to Chinese Patent Application No. 202410546500.9, filed on Apr. 29, 2024, which is hereby incorporated by reference in its entirety.

TECHNICAL FIELD

Examples of the present application relate to the technical field of semiconductors, and particularly to a memory device.

BACKGROUND

A memory device is a memory apparatus configured to store information in the modern information technology. With the increasingly high requirements for the memory apparatuses, there may still be much room for improvements in the memory device.

SUMMARY

In view of this, examples of the present application provide a memory device.

In a first aspect, examples of the present application provide a memory device. The memory device comprises: a first semiconductor structure comprising a memory cell array; a second semiconductor structure comprising at least a plurality of first control circuits and at least part of the peripheral circuit distributed at gaps of the plurality of first control circuits, wherein the first semiconductor structure and the second semiconductor structure are stacked and connected; a first interconnect layer located on a side of the second semiconductor structure that is away from the first semiconductor structure; and a plurality of connection structures penetrating through part of the second semiconductor structure, wherein one end of each connection structure is connected with at least part of the peripheral circuit at the gaps, and the other end is connected with the first interconnect layer.

In some examples, the memory device further comprises a second interconnect layer located between the first semiconductor structure and the second semiconductor structure, wherein the first semiconductor structure and the second semiconductor structure are connected through the second interconnect layer.

In some examples, the memory device further comprises a third interconnect layer, a first bonding layer, a second bonding layer, and a fourth interconnect layer, which are located between the first semiconductor structure and the second semiconductor structure and stacked, wherein the first semiconductor structure and the second semiconductor structure are connected through the third interconnect layer, the first bonding layer, the second bonding layer, and the fourth interconnect layer.

In some examples, the memory cell array comprises a plurality of memory banks, and the memory bank comprises a plurality of memory blocks; one first control circuit is connected with one memory block, and the peripheral circuit is connected with all the memory banks; at least part of the peripheral circuit comprises a plurality of first portions and one second portion; a boundary of a region in which one of the first portions and the first control circuit correspondingly connected with one respective memory block are disposed overlaps with a boundary of a region in which the respective memory block is disposed; a boundary of a region in which the second portion is disposed overlaps with a boundary of a gap between the adjacent memory blocks; and at least one of the second portion or the plurality of first portions is connected with the first interconnect layer through the plurality of connection structures.

In some examples, the first control circuit comprises a sensing amplifier circuit and a word line driver circuit; the sensing amplifier circuit is connected with a bit line in the memory block; and the word line driver circuit is connected with a word line in the memory block.

In some examples, the sensing amplifier circuit connected with the memory block is disposed in a first region and a second region; the word line driver circuit connected with the memory block is disposed in a third region and a fourth region; and the first region and the second region both extend along a first direction and are staggered along a second direction, the third region and the fourth region both extend along the second direction and are staggered along the first direction, the first direction is perpendicular to a direction in which the bit line extends, and the second direction is perpendicular to a direction in which the word line extends.

In some examples, a boundary of the first region is in contact with a boundary of the third region, and a boundary of the second region is in contact with a boundary of the fourth region; and a sum of sizes of the boundary of the first region and the boundary of the third region along the first direction is a first size, a size, along the first direction, of the boundary of the region in which the memory block is disposed is a second size, and the first size is less than the second size.

In some examples, the first semiconductor structure further comprises a first contact connected with the word line and a second contact connected with the bit line; the first contact and the second contact are both disposed on a side close to the second semiconductor structure; the second semiconductor structure further comprises a third contact connected with the sensing amplifier circuit and a fourth contact connected with the word line driver circuit; the third contact and the fourth contact are both disposed on a side close to the first semiconductor structure; and the second contact and the third contact, and the first contact and the fourth contact are all connected at least through the interconnect layer located between the first semiconductor structure and the second semiconductor structure.

In some examples, the second semiconductor structure comprises a plurality of active regions spaced apart by isolation regions; and the connection structures are disposed at boundaries of the active regions and in the isolation regions.

In some examples, the memory device further comprises a power supply wire, wherein the power supply wire is disposed in the first interconnect layer.

In some examples, the second semiconductor structure further comprises a plurality of second control circuits; one second control circuit is connected with one memory bank; the second control circuits are distributed in gaps of the plurality of first control circuits; and the second control circuit comprises a row decoding circuit and a column decoding circuit.

In some examples, a boundary of a region in which the second control circuit is disposed overlaps with a boundary of a gap between the adjacent memory banks.

In some examples, the memory device further comprises a pad, wherein the pad is located on a side of the first interconnect layer that is away from the second semiconductor structure, and is electrically connected with the first interconnect layer.

In some examples, the memory cell array comprises: a plurality of word lines extending along a first direction; a plurality of bit lines extending along a second direction; and a plurality of semiconductor pillars arranged in an array, and a storage structure corresponding to each of the plurality of semiconductor pillars, wherein the semiconductor pillar and the corresponding storage structure are stacked; the semiconductor pillar extends along a third direction, and is provided with a first end and a second end oppositely arranged in the third direction; the first end is connected with the bit line, and the second end is connected with the storage structure; the word line is coupled with at least one side of the semiconductor pillar; and the third direction is perpendicular to both the first direction and the second direction.

In some examples, the storage structure comprises a capacitor; and the capacitor comprises a cup-shaped capacitor, a cylindrical capacitor, or a pillar-shaped capacitor.

In some examples, the plurality of storage structures are arranged in a square shape or arranged in a hexagonal shape.

In some examples, the word line is coupled with one side of the semiconductor pillar; or the word line is coupled with two sides of the semiconductor pillar that are oppositely arranged; or the word line is coupled with various sides of the semiconductor pillar.

In some examples, a material of the semiconductor pillar comprises indium gallium zinc oxide.

In some examples, the memory device comprises a dynamic random access memory.

In a second aspect, examples of the present application provide another memory device. The memory device comprises: a first semiconductor structure comprising a memory cell array; a second semiconductor structure comprising at least a plurality of first control circuits and at least part of the peripheral circuit distributed at gaps of the plurality of first control circuits; a first interconnect layer located on a side of the second semiconductor structure that is away from the first semiconductor structure; a plurality of connection structures penetrating through part of the second semiconductor structure, wherein one end of each connection structure is connected with at least part of the peripheral circuit at the gaps, and the other end is connected with the first interconnect layer; and a second interconnect layer located between the first semiconductor structure and the second semiconductor structure, and connected with both the memory cell array and the first control circuit.

In some examples, the memory cell array comprises a plurality of memory banks, and the memory bank comprises a plurality of memory blocks; one first control circuit is connected with one memory block, and the peripheral circuit is connected with all the memory banks; at least part of the peripheral circuit comprises a plurality of first portions and one second portion; a boundary of a region in which one of the first portions and the first control circuit connected with one respective memory block are disposed overlaps with a boundary of a region in which the respective memory block is disposed; a boundary of a region in which the second portion is disposed overlaps with a boundary of a gap between the adjacent memory blocks; and at least one of the second portion or the plurality of first portions is connected with the first interconnect layer through the plurality of connection structures.

In some examples, the memory device further comprises a power supply wire, wherein the power supply wire is disposed in the first interconnect layer.

In a third aspect, examples of the present application provide still another memory device. The memory device comprises: a first semiconductor structure comprising a memory cell array; a second semiconductor structure comprising at least a plurality of first control circuits and at least part of the peripheral circuit distributed at gaps of the plurality of first control circuits; a first interconnect layer located on a side of the second semiconductor structure that is away from the first semiconductor structure; and a third interconnect layer, a first bonding layer, a second bonding layer, and a fourth interconnect layer, which are stacked, located between the first semiconductor structure and the second semiconductor structure, and all connected with the memory cell array and the first control circuit.

In some examples, the memory cell array comprises a plurality of memory banks, and the memory bank comprises a plurality of memory blocks; one first control circuit is connected with one memory block, and the peripheral circuit is connected with all the memory banks; at least part of the peripheral circuit comprises a plurality of first portions and one second portion; a boundary of a region in which one of the first portions and the first control circuit connected with one respective memory block are disposed overlaps with a boundary of a region in which the respective memory block is disposed; a boundary of a region in which the second portion is disposed overlaps with a boundary of a gap between the adjacent memory blocks; and at least one of the second portion or the plurality of first portions is connected with the first interconnect layer through the plurality of connection structures.

In some examples, the memory device further comprises a power supply wire, wherein the power supply wire is disposed in the first interconnect layer.

In various examples of the present application, the first semiconductor structure comprising the memory cell array and the second semiconductor structure comprising the first control circuit and the peripheral circuit are stacked. Compared to a solution of arranging the first semiconductor structure and the second semiconductor structure in juxtaposition, a storage density of the memory device can be increased; through utilization of routing on a back side of the second semiconductor structure, and by connecting the connection structure penetrating through the second semiconductor structure to at least part of the peripheral circuit, such that the at least part of the peripheral circuit may be scattered in the gaps of the first control circuits, and compared to direct arrangement of the entire peripheral circuit in a complete region, an extra area brought by the peripheral circuit in the second semiconductor structure is directly decreased, and thus a size of the memory device can be reduced, thereby further increasing the storage density of the memory device.

DETAILED DESCRIPTION

Figure 1:
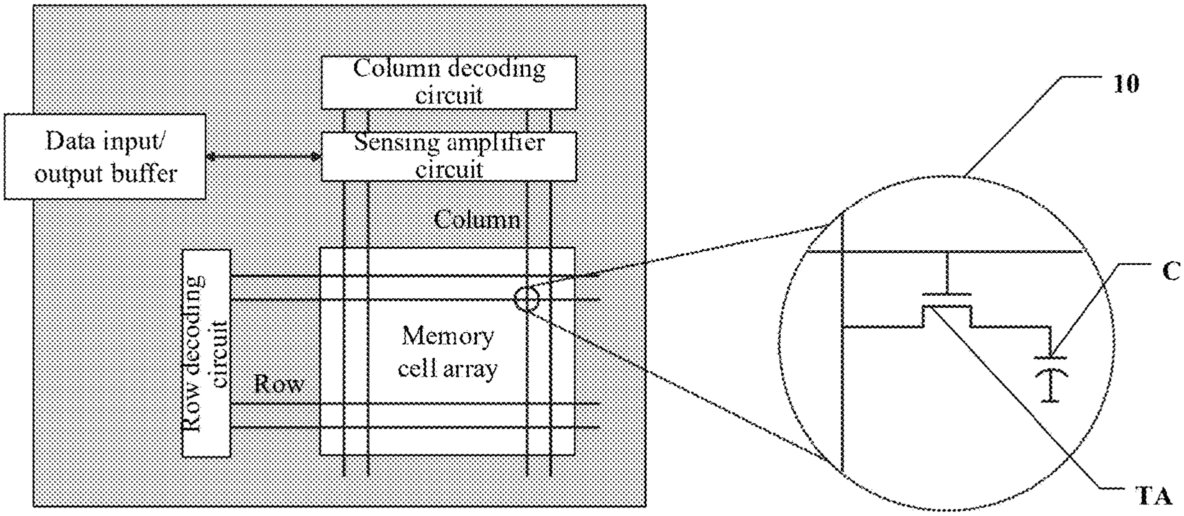
FIG. 1 is a schematic diagram of a constituent structure of an example dynamic random access memory according to an example of the present application.

The technical solutions in implementations of the present application will be described below clearly and completely in conjunction with the implementations and the drawings of the present application. Apparently, the implementations described are only part of, but not all of, the implementations of the present application. All other implementations obtained by those of ordinary skill in the art based on the implementations in the present application without creative work shall fall within the scope of protection of the present application.

In the description below, many specific details are presented to provide a more thorough understanding of the present application. However, it is apparent to those skilled in the art that the present application may be implemented without one or more of these details. In other examples, in order to avoid confusion with the present application, some technical features well-known in the art are not described. That is, all the features of the actual examples are not described herein, and well-known functions and structures are not described in detail.

In the drawings, the sizes of a layer, a region, and an element and their relative sizes may be exaggerated for clarity. Like reference numerals denote like elements throughout the specification.

It is to be understood that when an element or a layer is referred to as being "on", "adjacent to", "connected to", or "coupled to" other elements or layers, it may be directly on, adjacent to, connected to, or coupled to the other elements or layers, or intervening elements or layers may be present. In contrast, when an element is referred to as being "directly on", "immediately adjacent to", "directly connected to", or "directly coupled to" other elements or layers, no intervening elements or layers are present. It is to be understood that, although terms first, second, third and the like may be used to describe various elements, components, regions, layers and/or sections, these elements, components, regions, layers and/or sections should not be limited by these terms. These terms are only used to distinguish one element, component, region, layer or portion from another element, component, region, layer or portion. Therefore, without departing from the teaching of the present application, a first element, component, region, layer, or portion discussed below may be represented as a second element, component, region, layer, or portion. When the second element, component, area, layer or portion is discussed, it does not mean that the first element, component, area, layer or portion is necessarily present in the present application.

The spatially relative terms, such as "beneath", "below", "lower", "under", "above", "upper", and the like, may be used herein for ease of description to describe one element or feature's relationship to other elements or features as illustrated in the figures. It is to be understood that, the spatially relative terms are intended to further encompass different orientations of a device in use or operation in addition to the orientation depicted in the figures. For example, if the device in the drawings is turned over, then the elements or the features described as "below" or "under" or "beneath" other elements may be oriented "on" the other elements or features. Thus, the example terms, "below" and "beneath", may comprise both upper and lower orientations. The device may be orientated otherwise (rotated by 90 degrees or other orientations), and the spatially descriptive terms used herein are interpreted accordingly.

The terms used herein are only intended to describe the examples, and are not used as limitations of the present application. While used here, singular forms of "a", "an" and "said/the" are also intended to include plural forms, unless the context clearly indicates another mode. It is also to be understood that terms "consist of" and/or "comprise", when used in this specification, determine the presence of the described features, integers, steps, operations, elements and/ or components, but do not preclude the presence or addition of one or more of other features, integers, steps, operations, elements, components, and/or groups. As used herein, the term "and/or" comprises any or all combinations of the listed relevant items.

In order to understand the present application thoroughly, detailed steps and detailed structures will be proposed in the following description to set forth the technical solution of the present application. The detailed descriptions of examples of the present application are as follows. However, the present application may also have other implementations in addition to these detailed descriptions.

The memory device involved in examples of the present application may be a random access memory (RAM) such as a Dynamic Random Access Memory (DRAM), a synchronous DRAM (SDRAM), a static RAM (SRAM), a double data rate SDRAM (DDR SDRAM), a DDR2 SDRAM, a DDR3 SDRAM, a phase-change RAM (PRAM), a magnetic RAM (MRAM), a resistive RAM (RRAM), and the like. The following is described by using the DRAM as an example.

FIG. 1 is a schematic diagram of a constituent structure of an example dynamic random access memory according to an example of the present application.

A schematic circuit of a memory cell in the DRAM is shown on the right side of FIG. 1. The DRAM comprises at least one DRAM die, each DRAM die comprises a memory cell array, the memory cell array comprises a plurality of memory cells 10 arranged in an array, each memory cell 10 comprises one array transistor TA and one Capacitor C, and a main working mechanism of the memory cell is to utilize the amount of charge stored in the capacitor to represent whether a binary bit is 1 or 0. The memory cells are arranged in an array, which may be regarded as a typical net structure. The memory cell array employs rows and columns to designate addresses. By designating intersections of the rows and the columns (by designating row addresses and column addresses of the DRAM), and the memory controller may independently access each memory cell in a DRAM die, and perform read, write, or refresh operations on data stored therein.

The left side of FIG. 1 shows the memory cell array, word lines (rows), bit lines (columns), part of the control circuits, and part of the peripheral circuit in the DRAM. It is to be noted that, a row decoding circuit in the control circuit, in response to an address inputted to the row decoding circuit, select a word line to select a row of a memory cell to be accessed. The row decoding circuit decodes the input address, and enables (activates) a word line corresponding to the decoded address. A column decoding circuit in the control circuit selects one or more bit lines to input output data of a user to a part of the row of the memory cell corresponding to the selected word line.

Figure 2:
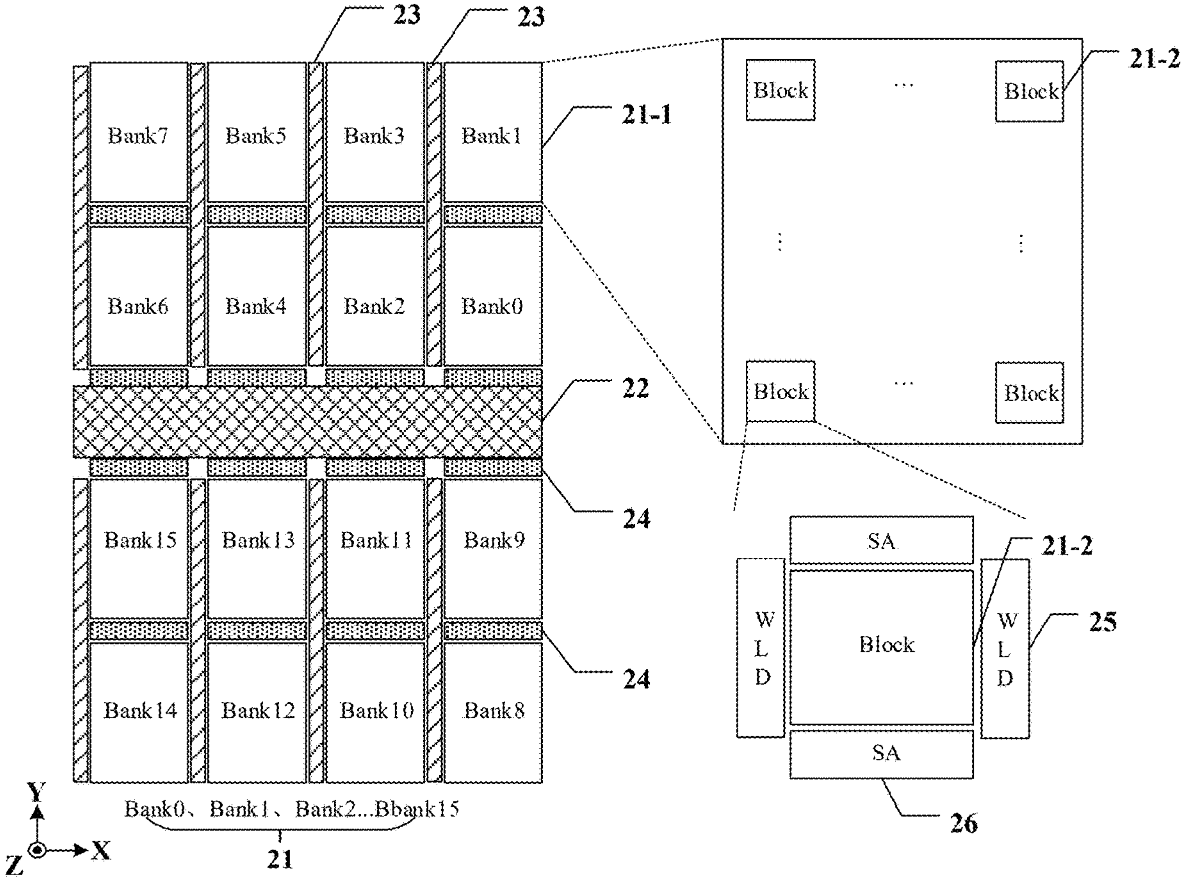
FIG. 2 is a schematic top view I of distribution of a memory cell array and a peripheral circuit in an example memory device according to an example of the present application.

FIG. 2 is a schematic top view I of distribution of a memory cell array and a peripheral circuit in an example memory device according to an example of the present application. One of layouts of the memory device is described in detail below with reference to FIG. 2. Before the memory device shown in FIG. 2 is introduced, various directions that may be used in descriptions below are defined first. Two directions parallel to a plane of a substrate (or a semiconductor structure) are defined as a first direction (i.e., X direction) and a second direction (i.e., Y direction). A direction perpendicular to the plane of the substrate (or the semiconductor structure) is defined as a third direction (i.e., Z direction). In some examples, the X direction, the Y direction, and the Z direction may be perpendicular to each other.

In an example, as shown in FIG. 2, the memory cell array 21 and the peripheral circuit 22 are arranged in juxtaposition. In an example, the memory cell array 21 comprises a plurality of (e.g., 16) memory banks 21-1 (Bank0-Bank15), each memory bank 21-1 comprises a plurality of memory blocks 21-2 (Block), a Sensing Amplifier (SA) circuit 26 and Word Line Driver (WLD) circuit 25 corresponding to the memory block are oppositely arranged at the periphery of each memory block 21-2, a column decoding circuit 24 and a row decoding circuit 23 corresponding to the memory bank are arranged on two sides of each memory bank, one memory bank row is formed by every several (e.g., 4) memory banks, and the peripheral circuit 22 corresponding to all the memory banks is arranged between two memory bank rows in the middle. It is to be noted that, the number of memory banks and a positional relationship of circuits in FIG. 2 are for example only, and are not used to limit the number of memory banks and the positional relationship of the circuits in the memory device in the present application.

Here and below, the peripheral circuit 22 is a control circuit corresponding to all the memory banks, in other words, all the memory banks share the peripheral circuit 22. The peripheral circuit 22 may include, but is not limited to, a command buffer, a command decoder, an address buffer, a data buffer, a mode register, etc. A first control circuit is a control circuit corresponding to the memory block, such as the SA, the WLD, etc. described above, that is to say, each memory block corresponds to one group of SAs and WLDs, and taking the convenience of routing into consideration, the group of SAs and WLDs corresponding to each memory block are arranged next to the respective memory block. A second control circuit is a control circuit corresponding to the memory bank, such as the column decoding circuit, the row decoding circuit, etc. described above, that is to say, each memory bank corresponds to one group of column decoding circuits and row decoding circuits, and taking the convenience of routing into consideration, the group of column decoding circuits and row decoding circuits corresponding to each memory bank are arranged next to the respective memory bank.

Figure 3A:
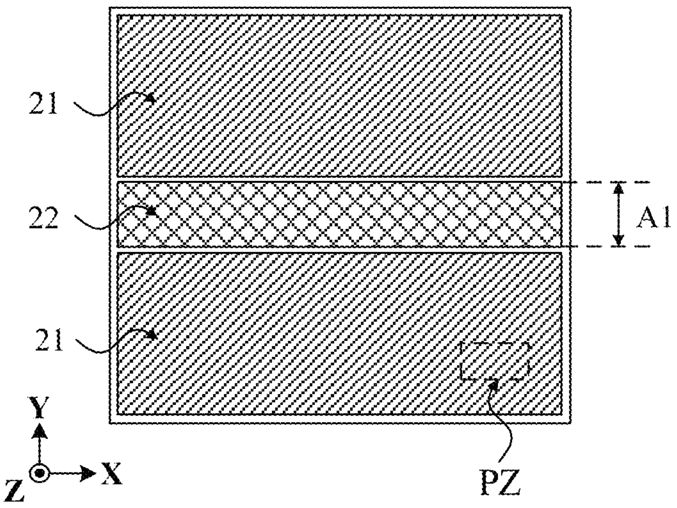
FIG. 3A is a schematic top view II of distribution of a memory cell array and a peripheral circuit in an example memory device according to an example of the present application.
Figure 3B:
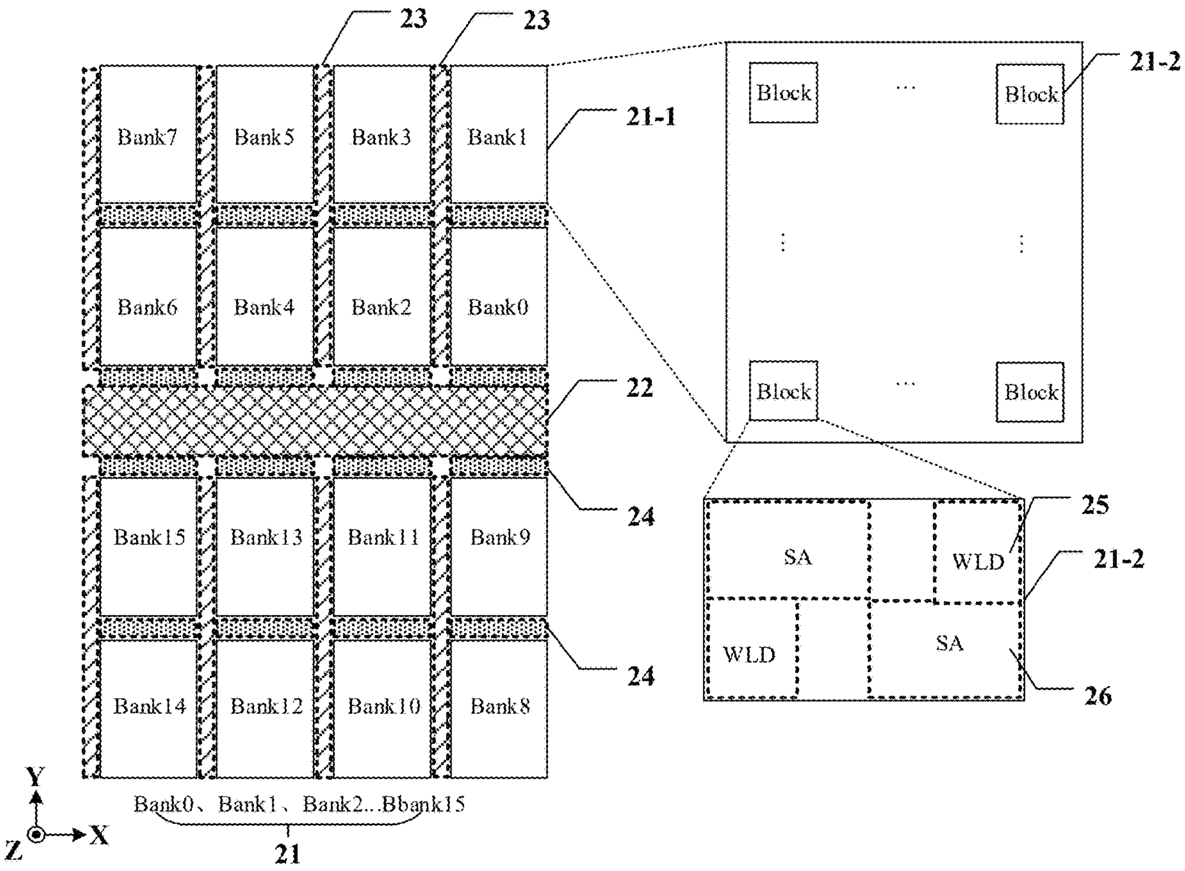
FIG. 3B is an unfolded schematic diagram of an example based on FIG. 3A according to an example of the present application.

FIG. 3A is a schematic top view II of distribution of a memory cell array and a peripheral circuit in an example memory device according to an example of the present application; FIG. 3B is an unfolded schematic diagram of an example based on FIG. 3A according to an example of the present application; and FIG. 3C is an enlarged schematic diagram of an example region PZ based on FIG. 3A according to an example of the present application.

Referring to FIGS. 3A and 3B, the memory device may be of a structure that is formed by stacking a first semiconductor structure comprising the memory cell array and a second semiconductor structure comprising the peripheral circuit along the Z direction, wherein a difference between FIG. 3B and FIG. 2 lies in that, the SA 26 and the WLD 25 of each memory block 21-2 are both arranged under each memory block. Based on this, in an enlarged view corresponding to each memory block 21-2 in FIG. 3B, a solid line represents an enlarged portion of the memory block 21-2 (Block), and a dashed line represents the SA 26 and the WLD 25 corresponding to the memory block 21-2 at a position right under the memory block 21-2 (Block). It is to be noted that, in some other examples, the position of the memory block 21-2 (Block) may be interchanged up and down with the positions of the SA 26 and the WLD 25 corresponding to the memory block 21-2. The following is described by only using the SA 26 and the WLD 25 being located under the memory block 21-2 as an example.

In FIG. 3A, the peripheral circuit 22 corresponding to all the memory banks is disposed on the second semiconductor structure. For case of wiring, a middle region of two memory cell arrays 21 disposed on the first semiconductor structure may be set to be vacant, that is, without placing devices, such that the peripheral circuit 22 located on the second semiconductor structure may be directly observed from a top view.

Figure 3C:
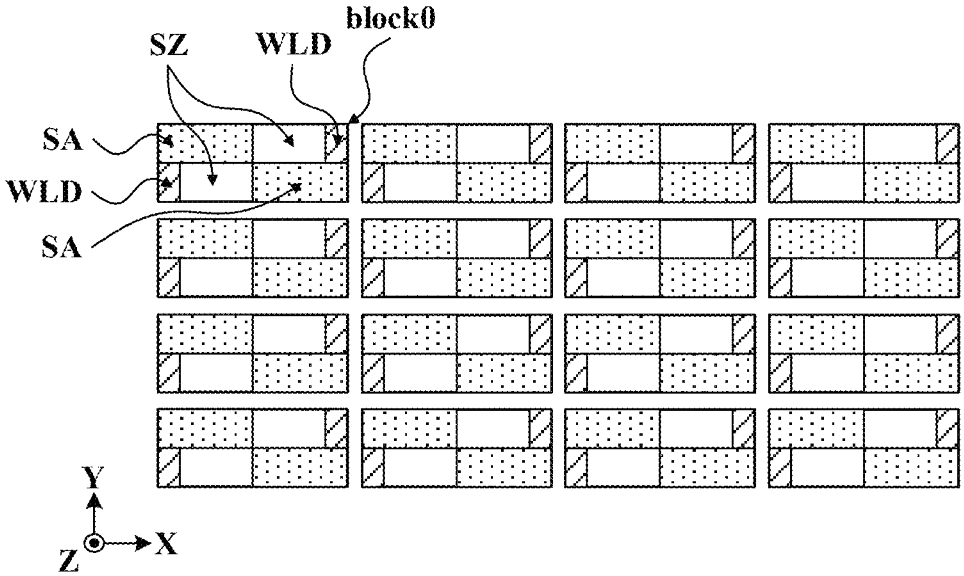
FIG. 3C is an enlarged schematic diagram of an example region PZ based on FIG. 3A according to an example of the present application.

A region PZ of FIG. 3A is marked with a dashed line, and indicates corresponding setting regions of the SAs 26 and the WLDs 25 corresponding to the memory blocks 21-2 at positions right under 16 memory blocks 21-2 (Block) are shown in FIG. 3C, for example, one memory block block0 corresponds to one SA located in two regions and one WLD located in two regions. In FIG. 3C, the plurality of SAs 26 and WLDs 25 that are arranged in an array and correspond to the plurality of memory blocks 21-2 arranged in an array are provided.

In the above-mentioned examples, the SAs and the WLDs corresponding to various memory blocks may be directly laid out under the respective memory blocks, without causing extra die areas. However, the peripheral circuit is laid out at the periphery of an orthographic projection of the memory cell array in a plane (X-Y plane) in which the second semiconductor structure is located, causing extra area occupation.

In the above-mentioned examples, considering that an area occupied by the peripheral circuit is generally large, if the peripheral circuit is scattered in separate independent regions, routing of interconnect lines of the scattered peripheral circuit is relatively complex, and the complex routing may mutually conflict with routing of the first control circuit and the second control circuit described above, as a result, the control circuits are centralized on the second semiconductor structure, and an area at a position of the first semiconductor structure corresponding to the peripheral circuit is basically vacant and wasted. As an integration level of a Complementary Metal Oxide Semiconductor (CMOS) increases, an area occupied by the first control circuit is reduced, the area occupied by the first control circuit corresponding to each memory block is less than an area occupied by the memory block, then in addition to laying out the first control circuit under the memory block, there may be vacant regions, and areas of the vacant regions are relatively considerable, based on this, the vacant regions may be rationally placed and spliced together through layout planning, so as to form a large region to place at least part of the peripheral circuit.

Figure 4A:
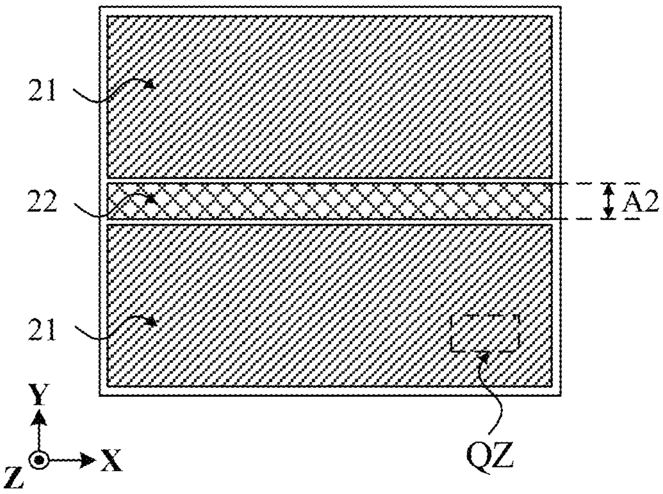
FIG. 4A is a schematic top view III of distribution of a memory cell array and a peripheral circuit in an example memory device according to an example of the present application.
Figure 4B:
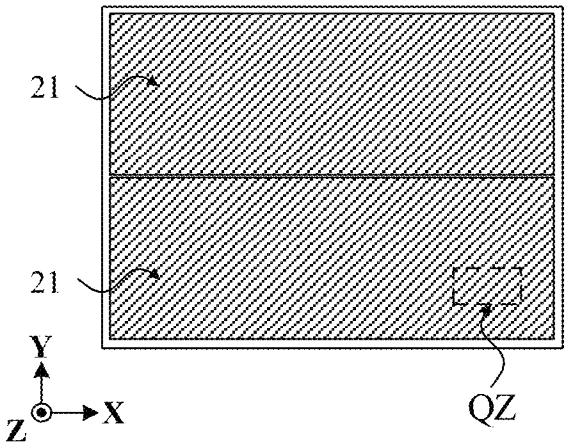
FIG. 4B is a schematic top view IV of distribution of a memory cell array and a peripheral circuit in an example memory device according to an example of the present application.
Figure 5A:
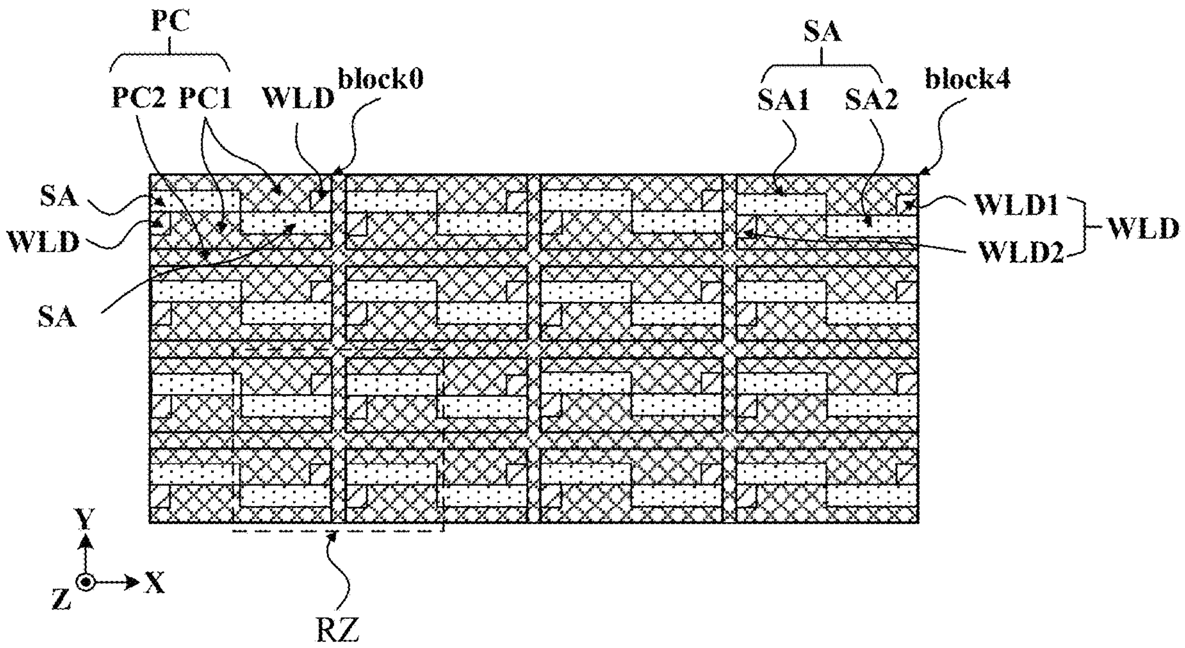
FIG. 5A is an enlarged schematic diagram of an example region QZ based on FIG. 4A or 4B according to an example of the present application.
Figure 5B:
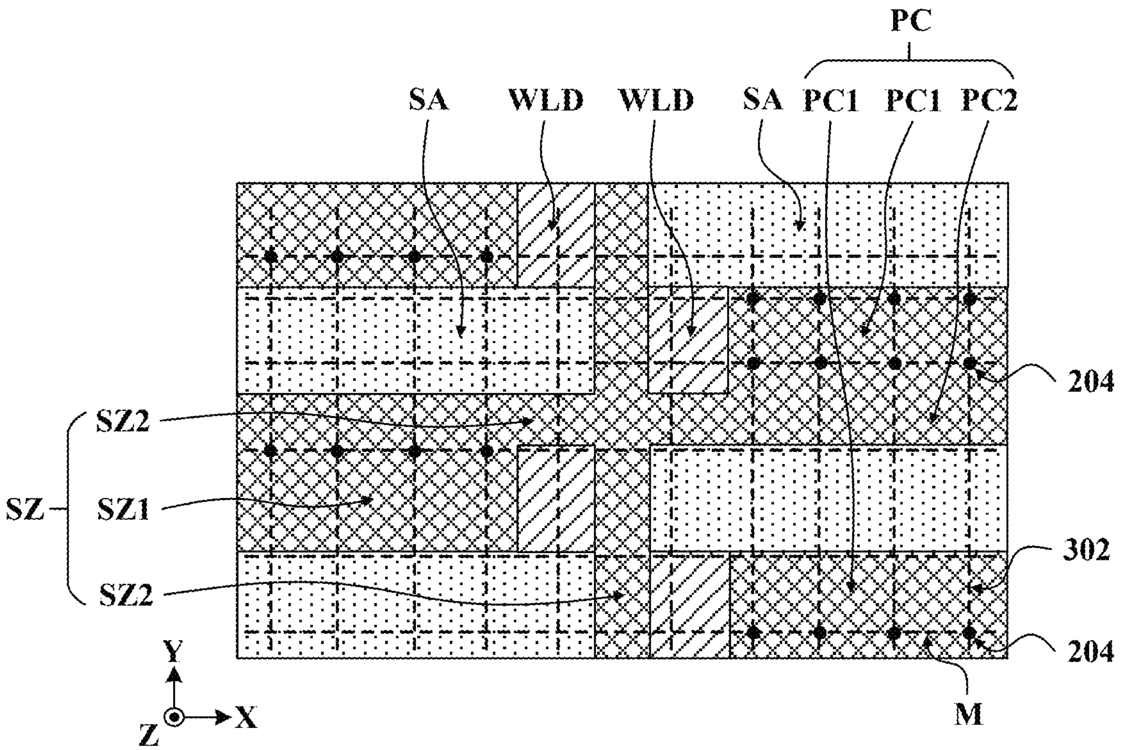
FIG. 5B is an enlarged schematic diagram of an example region RZ based on FIG. 5A according to an example of the present application.

FIG. 4A is a schematic top view III of distribution of a memory cell array and a peripheral circuit in an example memory device according to an example of the present application; and FIG. 4B is a schematic top view IV of distribution of a memory cell array and a peripheral circuit in an example memory device according to an example of the present application. FIG. 5A is an enlarged schematic diagram of an example region QZ based on FIG. 4A or 4B according to an example of the present application; and FIG. 5B is an enlarged schematic diagram of an example region RZ based on FIG. 5A according to an example of the present application.

In some examples, referring to FIGS. 4A, 4B, 5A, and 5B, compared to the memory device shown in FIGS. 3A to 3C, at least part of the peripheral circuit may be rationally placed in the provided memory device by utilizing the aforementioned vacant region, so as to directly reduce an extra area occupied by the peripheral circuit. Meanwhile, the second semiconductor structure with the peripheral circuit and the first control circuit is formed on a front side, wires connecting the first control circuit and the memory cell array are laid out on a front side of the second semiconductor structure, and wires connecting various peripheral circuits scattered in layout position gaps of the first control circuits are laid out on a back side of the second semiconductor structure, such that routing conflict between the two kinds of wires can be avoided, thereby achieving the purpose of saving areas on the premise that storage capacity remains unchanged and the performance of the control circuit is not degraded.

The memory device of FIG. 3A may be used as a control group of the memory device of FIGS. 4A and 4B; and the memory device of FIGS. 4A and 4B may be understood to place at least part of the peripheral circuit by directly utilizing the vacant region under the memory block of the memory device of FIG. 3A on the premise that the storage capacity of the memory device remains unchanged, or by utilizing a larger vacant region under the memory block after a size of the first control circuit is reduced. In FIG. 4A, part of the peripheral circuit is placed in the vacant regions; size A2 of the remaining of the peripheral circuit shown in FIG. 4A that is not placed in the vacant regions along a Y direction is less than size A1 of the corresponding peripheral circuit in FIG. 3A along the Y direction; and in FIG. 4B, the entire peripheral circuit is placed in the vacant regions, i.e., the entire peripheral circuit in FIG. 4B is disposed under the memory cell array. It is to be noted that, in some other examples, the position of the memory block may be interchanged up and down with the positions of the SA, WLD, and peripheral circuit in the vacant regions corresponding to the memory block. The following is described by only using the SA, the WLD, and the peripheral circuit in the vacant region being located under the memory block as an example.

FIG. 5A may be comparatively understood with FIG. 3C, and the plurality of SAs, WLDs and part of the peripheral circuit PC, which are arranged in an array and correspond to the plurality of memory blocks arranged in an array are provided. It is to be noted that, compared to FIG. 3C, a size product of the first control circuit in FIG. 5A is reduced, such that there is a larger vacant region under each memory block array to place at least part of the peripheral circuit PC.

Figure 6:
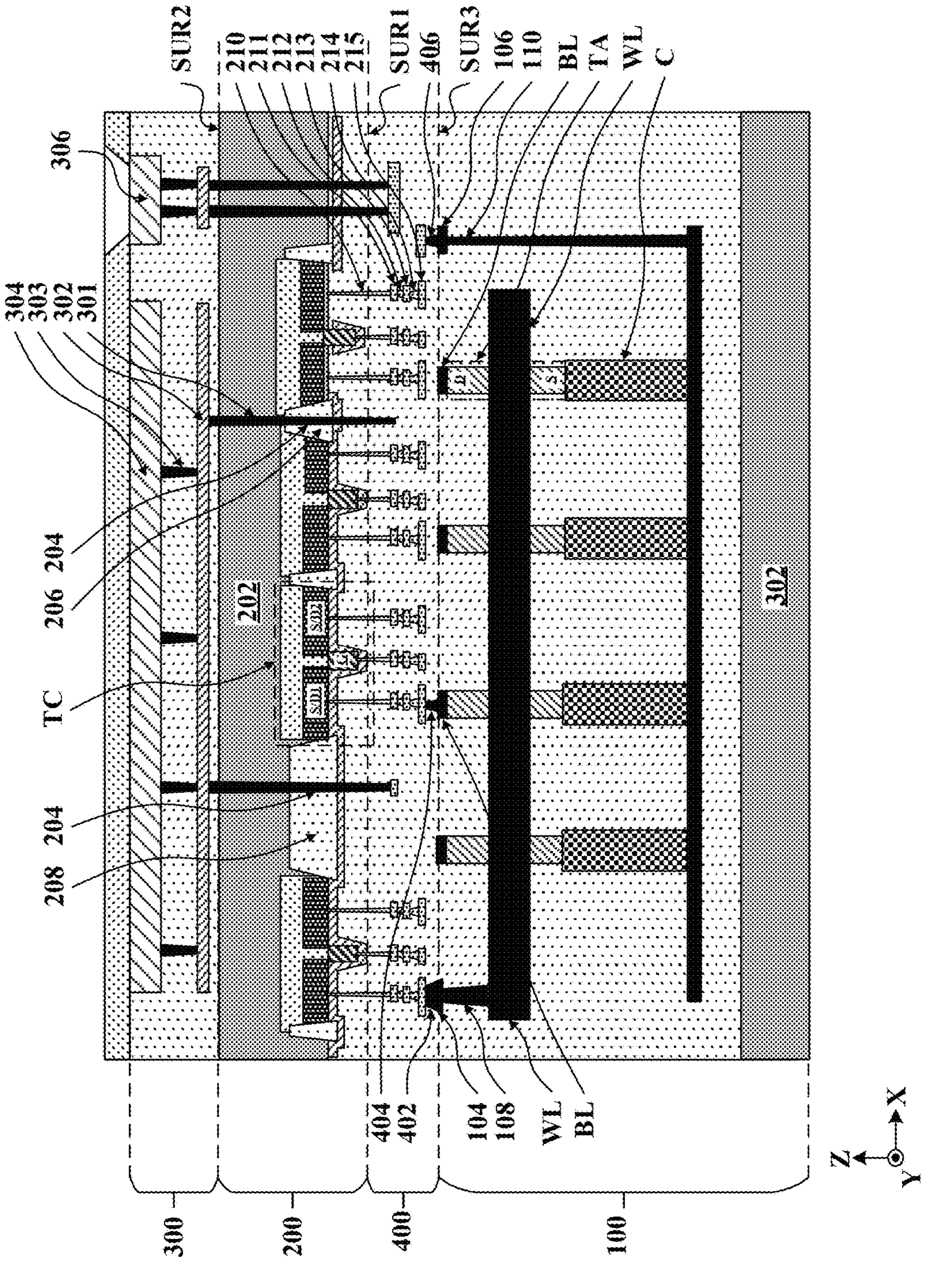
FIG. 6 is a schematic cross-sectional view I of a memory device provided by examples of the present application.
Figure 7:
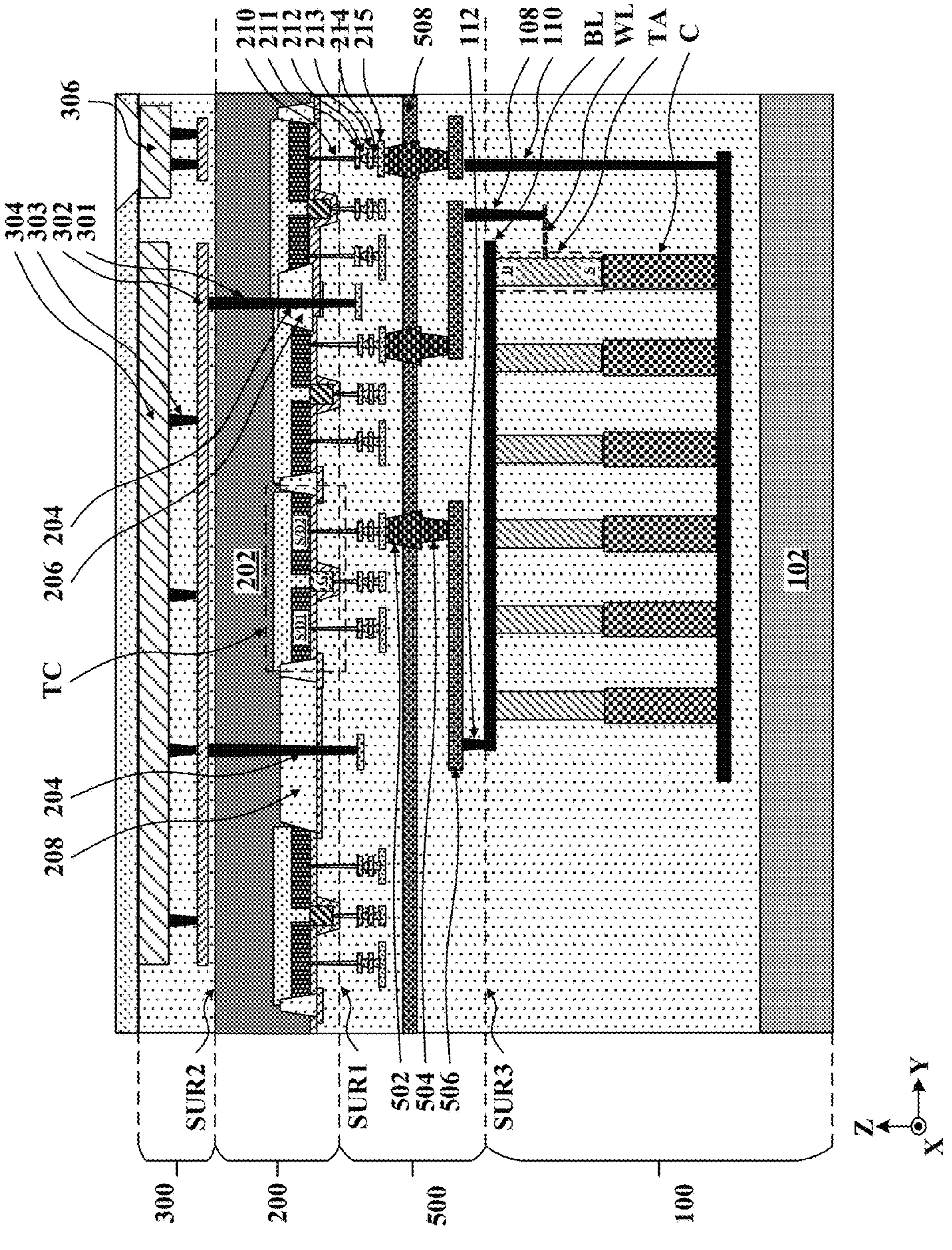
FIG. 7 is a schematic cross-sectional view II of a memory device provided by examples of the present application.

FIG. 5B employs a dashed line to perspectively show back side routing (which may be understood as a $3^{rd}$ level metal layer 302 in FIGS. 6 and 7) of the second semiconductor structure; and FIG. 5B also employs a solid dot to show a Through-Silicon Contact (TSC) (which may be understood as a connection structure 204 in FIGS. 6 and 7). It is to be noted that, back side routing, as well as through-silicon contact positions and quantity relationships, in FIG. 5B are for illustrating only, and are not used to limit routing, as well as through-silicon contact positions and quantity relationships, in the memory device in the present application.

Referring to FIG. 5B, back side routing is connected with at least part of the peripheral circuit through the through-silicon contacts, that is to say, the at least part of the peripheral circuit in the vacant regions are connected through the back side routing and the through-silicon contacts, and the connection lines do not conflict with front routing of the first control circuit located on the front side of the second semiconductor structure.

Referring to FIG. 5B, in some examples, a routing channel of metal interconnect lines in the back side routing of the second semiconductor structure may be configured to lay out a power bus, and since a distance of the power bus from the routing of the peripheral circuit is relatively close, a power supply has a very low voltage drop, such that a high utilization rate is achieved. Meanwhile, a metal layer on the back side of the second semiconductor structure for interconnect of the peripheral circuit and a metal layer for power bus layout may share part of the metal layers, such that a total number of metal layers on the front side and the back side can be reduced, thereby saving process cost.

In a first aspect, examples of the present application provide a memory device. Referring to FIGS. 6 and 7, the memory device comprises: a first semiconductor structure comprising a memory cell array; a second semiconductor structure comprising at least a plurality of first control circuits and at least part of the peripheral circuit distributed at gaps of the plurality of first control circuits, wherein the first semiconductor structure and the second semiconductor structure are stacked and connected; a first interconnect layer located on a side of the second semiconductor structure that is away from the first semiconductor structure; and a plurality of connection structures penetrating through part of the second semiconductor structure, wherein one end of each connection structure is connected with at least part of the peripheral circuit at the gaps, and the other end is connected with the first interconnect layer.

Here and below, a first direction may also be understood as a direction in which a word line (WL) extends, and is represented as an X direction in the drawings; a second direction may also be understood as a direction in which a bit line (BL) extends, and is represented as a Y direction in the drawings; and a third direction may also be understood as a direction in which the first semiconductor structure and the second semiconductor structure are stacked, and is represented as a Z direction in the drawings.

It is to be noted that, the cross section shown in FIG. 6 is a cross section that is constituted by a direction in which a word line in a memory device extends and a direction in which the first semiconductor structure and the second semiconductor structure are stacked, and is represented as an X-Z cross section in the drawings; and the cross section shown in FIG. 7 is a cross section that is constituted by a direction in which a bit line of another memory device extends and a direction in which the first semiconductor structure and the second semiconductor structure are stacked, and is represented as a Y-Z cross section in the drawings.

It is to be noted that, components/circuits/devices, etc. marked with same numbers in FIGS. 6 and 7 may be understood as same or similar components/circuits/devices.

The first semiconductor structure 100 may comprise a memory cell array. Each memory cell in the memory cell array may be understood with reference to the aforementioned descriptions with respect to the memory cell in FIG. 1. A capacitor C may be formed according to plane configuration, stacking configuration, or trench configuration, depending on a manufacturing method. The capacitor C may be coupled to a first doping area (e.g., a source area S) of an array transistor TA, so as to be charged or discharged through the first doping area. A word line WL may be coupled to a gate of the array transistor TA, so as to turn on or turn off the array transistor TA. A bit line BL may be coupled to a second doping area (e.g., a drain area D) of the array transistor TA, and act as a path for charging or discharging the capacitor C.

The second semiconductor structure 200 may comprise the first control circuit and at least part of the peripheral circuit. The first control circuit and the peripheral circuit may comprise any suitable analog, digital, and hybrid signal circuits for promoting operations of the memory cell array by applying and sensing voltage signals and/or current signals to and from each target memory cell via the bit line or the word line. The first control circuit and the peripheral circuit may comprise various types of circuits formed using the MOS technology. The first control circuit and the at least part of the peripheral circuit may both comprise a plurality of peripheral transistors TC to form control circuits that are configured to perform operations (e.g., writing or reading storage elements of the memory cell array) on the memory cell array.

As described above, the peripheral circuit is a control circuit corresponding to all memory banks, in other words, all the memory banks share the peripheral circuit. The peripheral circuit may include, but is not limited to, a command buffer, a command decoder, an address buffer, a data buffer, a mode register, etc. A first control circuit is a control circuit corresponding to a memory block, such as an SA, a WLD, etc., that is to say, each memory block corresponds to one group of SAs and WLDs.

The SA is configured to sense a low power signal that is from the bit line BL and represents a data bit (one or zero) stored in a DRAM memory cell, and amplify a small voltage swing to a recognizable logic level, so as to correctly interpret data by a logic cell outside the DRAM memory device. The WLD may be configured to apply a respective drive voltage to a word line of a selected/unselected memory block.

In some examples, the second semiconductor structure 200 comprises a first substrate 202 and a peripheral transistor TC located on a front side of a second substrate. In some examples, the first substrate 202 may comprise silicon (Si), germanium (Ge), and silicon germanium (SiGe) substrates, and the like. The first substrate 202 may also be a Silicon on Insulator (SOI) or a Germanium on Insulator (GOI). In some examples, certain impurity ions are doped in the first substrate 202 according to requirements; the impurity ions may be N-type impurity ions or P-type impurity ions; and doping comprises well region doping and source/drain region doping. In some examples, the peripheral transistor TC may comprise an NMOS transistor formed in a P well and a PMOS transistor formed in an N well. The plurality of peripheral transistors TC are mutually connected through metal interconnect layers, so as to obtain the first control circuit and at least part of the peripheral circuit.

In some examples, the front side metal interconnect layer may be a metal interconnect layer on a side (i.e., a side close to a first side SUR1 (or referred to as a front side) of the second semiconductor structure 200) of the first substrate 202 having the peripheral transistors TC; and the metal interconnect layer comprises a contact and a metal interconnect line. In some examples, the front side metal interconnect layer comprises a plurality of metal layers and a plurality of contacts, which are alternately stacked and mutually connected. In some examples, the number of stacking layers of the front side metal interconnect layer is three, comprising a $0^{th}$ level contact 210, a $0^{th}$ level metal layer 211, a $1^{st}$ level contact 212, a $1^{st}$ level metal layer 213, a $2^{nd}$ level contact 214, and a $2^{nd}$ level metal layer 215, which are stacked in sequence, wherein the plurality of metal layers comprise the $0^{th}$ level metal layer 211, the $1^{st}$ level metal layer 213, and the $2^{nd}$ level metal layer 215; and the plurality of contacts comprise the $0^{th}$ level contact 210, the $1^{st}$ level contact 212, and the $2^{nd}$ level contact 214. The $0^{th}$ level contact 210 extends and is coupled to a first source/drain S/D1 or second source/drain S/D2 of the peripheral transistor TC, or extends to a gate G of the peripheral transistor TC. Here and below, materials of the contacts and the metal interconnect lines include, but are not limited to, tungsten, cobalt, nickel, copper, aluminum, polysilicon, doped silicon, silicides, nitrides, or any combination thereof.

The first interconnect layer 300 is located on a side of the second semiconductor structure 200 that is away from the first semiconductor structure 100. In an example, the first interconnect layer 300 may be understood as a back side metal interconnect layer; the back side metal interconnect layer may be a metal interconnect layer that is formed on a second side SUR2 (or referred to as a back side) of the second semiconductor structure 200; and the metal interconnect layer comprises the contacts and the metal interconnect lines.

In some examples, the back side metal interconnect layer comprises a plurality of metal layers and a plurality of contacts, which are alternately stacked and mutually connected. In some examples, the number of stacking layers of the back side metal interconnect layer is two, comprising a $3^{rd}$ level contact 301, a $3^{rd}$ level metal layer 302, a $4^{th}$ level contact 303, and a $4^{th}$ level metal layer 304, which are stacked in sequence, wherein the plurality of metal layers comprise the $3^{rd}$ level metal layer 302 and the $4^{th}$ level metal layer 304; and the plurality of contacts comprise the $3^{rd}$ level contact 301 and the $4^{th}$ level contact 303. The $3^{rd}$ level contact 301 (which may be understood as the connection structure 204) extends and is coupled to the front side metal interconnect layer, for example, the $3^{rd}$ level contact 301 extends and is coupled to the $0^{th}$ level metal layer 211. In some examples, a material of the $3^{rd}$ level metal layer 302 is the same as or different from a material of the $4^{th}$ level metal layer 304; and in some examples, the material of the $4^{th}$ level metal layer 304 comprises aluminum or aluminum alloy, and the material of the $3^{rd}$ level metal layer 302 comprises copper or copper alloy.

The connection structure 204 penetrates through part of the second semiconductor structure 200; and one end is connected with the at least part of the peripheral circuit at the gaps, and the other end is connected with the first interconnect layer 300. In an example, the connection structure 204 penetrates through the first substrate 202; one end extends to the front side metal interconnect layer to connect with at least part of the peripheral circuit in the second semiconductor structure 200, and the other end extends to the back side metal interconnect layer to connect with the first interconnect layer 300; and for example, the connection structure 204 separately extends to the $3^{rd}$ level metal layer 302 and the $0^{th}$ level metal layer 211 at two ends thereof by penetrating through the first substrate 202.

The gaps may be understood as first insulation structures 206 that separate a plurality of active regions in the first substrate 202, or may also be understood as second insulation structures 208 that separate a plurality of well regions (P wells/N wells) in the first substrate 202. The first insulation structures 206 and the second insulation structures 208 located in the first substrate 202 may be obtained through a Shallow Trench Isolation (STI) process. Materials of the first insulation structures 206 and the second insulation structures 208 include, but are not limited to, silicon oxide, silicon nitride, and silicon oxynitride, or any combination thereof.

Details for the interconnect between layers of the first semiconductor structure 100 and the second semiconductor structure 200 may be referred to descriptions below.

In the examples of the present application, through the stacking arrangement of the first semiconductor structure and the second semiconductor structure, a storage density of the memory device can be significantly increased; through the utilization of routing on the back side of the second semiconductor structure, and by connecting same to at least part of the peripheral circuit through the connection structure, the at least part of the peripheral circuit is scattered below the memory block of the memory cell array, such that the area occupied by the peripheral circuit in the second semiconductor structure are directly reduced; and the routing on the back side of the second semiconductor structure can realize the interconnects among the at least part of the peripheral circuit scattered, without conflicting with the connection of routing on the front side of the second semiconductor structure.

Referring to FIG. 6, in some examples, the memory device further comprises a second interconnect layer located between the first semiconductor structure and the second semiconductor structure, wherein the first semiconductor structure and the second semiconductor structure are connected through the second interconnect layer. The second interconnect layer 400 may be a metal interconnect layer that is formed on the first side SUR1 (or referred to as the front side) of the second semiconductor structure 200 and a third side SUR3 of the first semiconductor structure 100 (the third side SUR3 may be understood as a side of the first semiconductor structure 100 that is close to a first side SUR1). The second interconnect layer 400 may comprise one or more interconnect layers, for example, comprising the aforementioned $0^{th}$ level contact 210, $0^{th}$ level metal layer 211, $1^{st}$ level contact 212, $1^{st}$ level metal layer 213, $2^{nd}$ level contact 214, $2^{nd}$ level metal layer 215, the second interconnect layer 400, a word line contact 402, and a bit line contact 404, etc, which are stacked in sequence. Materials of the word line contact 402 and the bit line contact 404 include, but are not limited to, tungsten, cobalt, nickel, copper, aluminum, polysilicon, doped silicon, silicides, nitrides, or any combination thereof. In some examples, the second interconnect layer further comprises a capacitor common electrode contact 406. A material of the capacitor common electrode contact 406 includes, but is not limited to, tungsten, cobalt, nickel, copper, aluminum, polysilicon, doped silicon, silicides, nitrides, or any combination thereof.

It is to be noted that, in the example shown in FIG. 6, the first semiconductor structure and the second semiconductor structure are connected only through the second interconnect layer therebetween. A third substrate 302 is a substrate for a load-bearing function, and is not used as a substrate being a base for growth; and the third substrate 302 may be selectively removed. That is to say, the first semiconductor structure and the second semiconductor structure in the example shown in FIG. 6 are both grown and formed on the basis of the first substrate 202, such that the use of a growth substrate can be reduced, so as to save cost.

Referring to FIG. 7, in some examples, the memory device further comprises a third interconnect layer, a first bonding layer, a second bonding layer, and a fourth interconnect layer, which are located between the first semiconductor structure and the second semiconductor structure and stacked, wherein the first semiconductor structure and the second semiconductor structure are connected through the third interconnect layer, the first bonding layer, the second bonding layer, and the fourth interconnect layer.

Here and below, the third interconnect layer, the first bonding layer, the second bonding layer, and the fourth interconnect layer may be called bonding interconnect structures 500 for short. The bonding interconnect structure 500 comprises a contact and a metal interconnect line.

The third interconnect layer and the first bonding layer may be metal interconnect layers (comprising the contacts and the metal interconnect lines) that are formed on the first side SUR1 (or referred to as the front side) of the second semiconductor structure 200. The third interconnect layer may comprise one or more interconnect layers, for example, comprising the aforementioned $0^{th}$ level contact 210, $0^{th}$ level metal layer 211, $1^{st}$ level contact 212, $1^{st}$ level metal layer 213, $2^{nd}$ level contact 214, $2^{nd}$ level metal layer 215, which are stacked in sequence. The first bonding layer may comprise a first bonding contact 502. The fourth interconnect layer and the second bonding layer may be metal interconnect layers (comprising the contacts and the metal interconnect lines) that are formed on the third side SUR3 of the first semiconductor structure 100. The fourth interconnect layer may comprise one or more interconnect layers, for example, comprising a $5^{th}$ level metal layer 506. The second bonding layer may comprise a second bonding contact 504. The second semiconductor structure 200 having the first bonding contact 502 and the first semiconductor structure 100 having the second bonding contact 504 may obtain the bonding interconnect structures 500 having bonding interfaces 508 through a hybrid bonding process, etc.; and the first bonding contact 502 and the second bonding contact 504 are in mutual contact and conductively connected.

It is to be noted that, in the example shown in FIG. 7, the first semiconductor structure and the second semiconductor structure are connected in a bonding manner. The first substrate 202 is configured to serve as a growth substrate of the second semiconductor structure 200; and the second substrate 102 is used as a growth substrate of the first semiconductor structure 100. That is to say, the first semiconductor structure and the second semiconductor structure in the example shown in FIG. 7 are respectively grown and manufactured by employing different substrates, such that the problem of mutual restriction between a manufacturing process of the memory cell array and a manufacturing process of the peripheral circuit can be solved to shorten a development cycle of the memory device.

Referring to FIG. 5B, in some examples, the memory cell array comprises a plurality of memory banks, and the memory bank comprises a plurality of memory blocks; one first control circuit is connected with one memory block, and the peripheral circuit is connected with all the memory banks; at least part of the peripheral circuit comprises a plurality of first portions and one second portion; a boundary of a region in which one of the first portions and the first control circuit correspondingly connected with one respective memory block are disposed overlaps with a boundary of a region in which the respective memory block is disposed; a boundary of a region in which the second portion is disposed overlaps with a boundary of a gap between the adjacent memory blocks; and at least one of the second portion or the plurality of first portions is connected with the first interconnect layer through the plurality of connection structures.

In some examples, the memory cell array may comprise a plurality of memory banks, for example, 16 memory banks; and the number of memory banks may be less than 16 or greater than 16. Each memory bank may comprise a plurality of memory blocks, for example, 16 memory blocks; and the number of memory blocks may be less than 16 or greater than 16.

In some examples, a vacant region SZ may comprise a first vacant region SZ1 located in a projection region below the memory block in addition to laying out the first control circuit, and may further comprise a second vacant region SZ2 located in a projection region below the gap between the adjacent memory blocks. The number of the first vacant regions SZ1 is the same as the number of memory blocks comprised in the memory cell array.

In an example, at least part of the peripheral circuit comprises a plurality of first portions PC1 (two first portions PC1 are shown in FIG. 5B) located in the first vacant region SZ1, and one second portion PC2 located in the second vacant region SZ2. The two first portions PC1 shown in FIG. 5B are located below the memory block and spaced apart; and the second portion PC2 serves as an entirety below a position between the adjacent memory blocks. The two first portions PC1 and the second portion PC2 are all connected to the $3^{rd}$ level metal layer 302 of the first interconnect layer through the plurality of connection structures 204.

Referring to FIGS. 6 and 7, in some examples, the first control circuit comprises a sensing amplifier circuit and a word line driver circuit; the sensing amplifier circuit is connected with a bit line in the memory block; and the word line driver circuit is connected with a word line in the memory block.

Referring to FIG. 6, in some examples, the first semiconductor structure 100 may comprise the memory cell array, and the first control circuit of the second semiconductor structure 200 may comprise the word line driver circuit and the sensing amplifier circuit, wherein the word line WL of the memory cell array may be connected with the word line driver circuit through the word line contact 402, and the bit line BL of the memory cell array may be connected with the sensing amplifier circuit through the bit line contact 404. In some examples, the word line WL may be connected with the word line contact 402 through a word line connection structure 108 and a word line landing pad 104. Furthermore, the capacitor C may be connected with the capacitor common electrode contact 406 through a capacitor connection structure 110 and a capacitor landing pad 106.

Referring to FIG. 7, in some examples, the first semiconductor structure 100 may comprise the memory cell array, and the first control circuit of the second semiconductor structure 200 may comprise the word line driver circuit and the sensing amplifier circuit, wherein the word line WL of the memory cell array may be connected with the word line driver circuit through the bonding interconnect structure 500, and the bit line BL of the memory cell array may be connected with the sensing amplifier circuit through the bonding interconnect structure 500. In some examples, the word line WL, the bit line BL, and the capacitor C of the memory cell array in the first semiconductor structure 100 may be respectively connected to the $5^{th}$ level metal layer 506 of the bonding interconnect structure 500 through the word line connection structure 108, a bit line connection structure 112, and the capacitor connection structure 110, are connected to the plurality of second bonding contacts 504 and the plurality of first bonding contacts 502 of the bonding interconnect structure 500 through the $5^{th}$ level metal layer 506 of the bonding interconnect structure 500, and are respectively connected to the word line driver circuit and the sensing amplifier circuit in the second semiconductor structure 200 through the plurality of first bonding contacts 502.

In some examples, at least one of the word line connection structure 108 or the bit line connection structure 112 may be located right below the memory block.

Referring to FIG. 5A, in some examples, the sensing amplifier circuit connected with the memory block is disposed in a first region and a second region; the word line driver circuit connected with the memory block is disposed in a third region and a fourth region; and the first region and the second region both extend along a first direction and are staggered along a second direction, the third region and the fourth region both extend along the second direction and are staggered along the first direction, the first direction is perpendicular to a direction in which the bit line extends, and the second direction is perpendicular to a direction in which the word line extends.

Herein, the first region and the second region are configured to place the sensing amplifier circuit, and considering that the sensing amplifier circuit is connected with the bit line and the bit line extends along the second direction and arranged along the first direction, in order to facilitate convenient routing of the bit line and the sensing amplifier circuit, if the connection structure between the bit line and the sensing amplifier circuit extends along a Z direction, the first region and the second region both extend along the first direction. The third region and the fourth region are configured to place the word line driver circuit, and considering that the word line driver circuit is connected with the word line and the word line extends along the first direction and arranged along the second direction, in order to facilitate convenient routing of the word line and the word line driver circuit, the third region and the fourth region both extend along the second direction. It is to be noted that, position adjustment may be performed on the SA and the WLD in a corresponding region (projection region) under the memory block according to actual requirements; a position layout between the SA and the WLD mainly takes the convenience of the connection between the word line and the bit line in the memory block into consideration, without fragmenting the corresponding region under the memory block too much.

It can be understood that, the SA and the WLD corresponding to the memory block are provided in the corresponding region (projection region) right below the memory block, such that a total length of the routing from the bit line to the sensing amplifier circuit can be decreased, a coupling effect is reduced, and a sensing window is enlarged.

In some other examples, in a corresponding region below a memory block block4, the first region and the second region are arranged diagonally and adjacent to each other, and the third region and the fourth region are arranged diagonally and separated from each other. The sensing amplifier circuit, also referred to as the sensing amplifier circuit SA, comprises a first sensing portion SA1 and a second sensing portion SA2 respectively arranged in the first region and the second region; and the word line driver circuit, also referred to as the word line driver circuit WLD, comprises a first driver portion WLD1 and a second driver portion WLD2 respectively arranged in the third region and the fourth region. In some examples, a sum of sizes, along the first direction, of boundaries of regions in which the first sensing portion SA1 and the second sensing portion SA2 are disposed is less than or equal to a size, along the first direction, of a boundary of a region in which the memory block block4 is disposed (a less-than case is shown in FIG. 5A); and a sum of sizes, along the second direction, of boundaries of regions in which the first driver portion WLD1 and the second driver portion WLD2 are disposed is less than or equal to a size, along the second direction, of a boundary of a region in which the memory block block4 is disposed (an equal case is shown in FIG. 5A).

In some examples, a boundary of the first region is in contact with a boundary of the third region, and a boundary of the second region is in contact with a boundary of the fourth region; and a sum of sizes of the boundary of the first region and the boundary of the third region along the first direction is a first size, a size, along the first direction, of the boundary of the region in which the memory block is disposed is a second size, and the first size is less than the second size.

Herein, the first size is less than the second size such that there may be more vacant regions to place the peripheral circuit.

Figure 8:
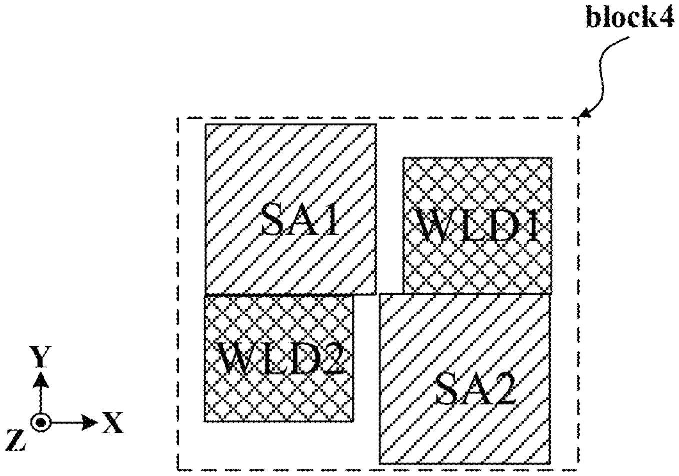
FIG. 8 is a plan layout I of a first control circuit corresponding to one memory block of a memory device provided by examples of the present application.

Referring to FIG. 8, in some other examples, in the corresponding region below the memory block block4, the first region and the second region are arranged diagonally and adjacent to each other, and the third region and the fourth region are arranged diagonally and separated from each other. The sensing amplifier circuit, also referred to as the sensing amplifier circuit SA, comprises a first sensing portion SA1 and a second sensing portion SA2 respectively arranged in the first region and the second region; the sum of sizes of the first sensing portion SA1 and the second sensing portion SA2 is less than a size of the memory block block4 along the first direction; the word line driver circuit, also referred to as the word line driver circuit WLD, comprises a first driver portion WLD1 and a second driver portion WLD2 respectively arranged in the third region and the fourth region; and the sum of sizes of the first driver portion WLD1 and the second driver portion WLD2 along the second direction is less than a size of the memory block block4 along the second direction.

Figure 9:
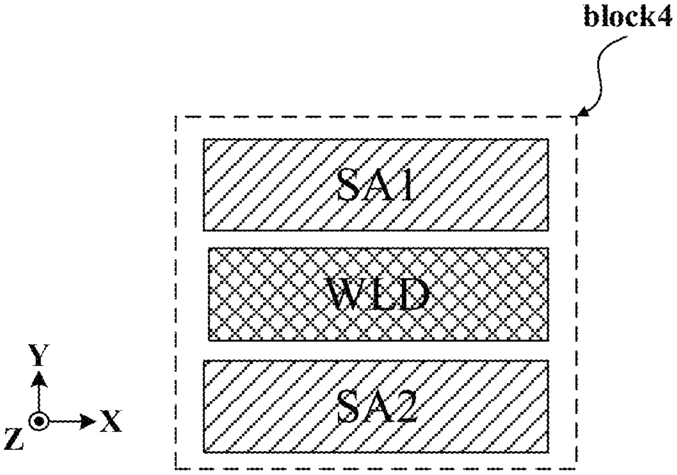
FIG. 9 is a plan layout II of a first control circuit corresponding to one memory block of a memory device provided by examples of the present application.

Referring to FIG. 9, in some examples, in the corresponding region below the memory block block4, the sensing amplifier circuit SA and the word line driver circuit WLD both extend along the first direction; the sensing amplifier circuit SA comprises two portions (the first sensing portion SA1 and the second sensing portion SA2) spaced apart from each other along the second direction; and the word line driver circuit WLD is an entirety located between the first sensing portion SA1 and the second sensing portion SA2. The sizes, along the first direction, of the boundaries of the regions in which the first sensing portion SA1 and the second sensing portion SA2 are disposed are less than the size, along the first direction, of the boundary of the region in which the memory block block4 is disposed; a size, along the second direction, of a boundary of a region in which the word line driver circuit WLD is disposed is less than the size of the memory block block4 along the second direction; and a size, along the first direction, of a boundary of a region in which the word line driver circuit WLD is disposed is less than the size, along the first direction, of the boundary of the region in which the memory block block4 is disposed.

Referring to FIGS. 6 and 7, in some examples, the first semiconductor structure 100 further comprises a first contact connected with the word line WL and a second contact connected with the bit line BL; the first contact and the second contact are both disposed on a side close to the second semiconductor structure; the second semiconductor structure 200 further comprises a third contact connected with the sensing amplifier circuit and a fourth contact connected with the word line driver circuit; the third contact and the fourth contact are both disposed on a side close to the first semiconductor structure; and the second contact and the third contact, and the first contact and the fourth contact are all connected at least through the interconnect layer located between the first semiconductor structure and the second semiconductor structure.

Herein, the first contact may be understood as the word line connection structure 108 and the word line landing pad 104 of FIG. 6; the second contact may be understood as the bit line contact 404 of FIG. 6; the third contact may be understood as a portion in the front side metal interconnect layer of FIG. 6 that is connected to the sensing amplifier circuit; and the fourth contact may be understood as a portion in the front side metal interconnect layer of FIG. 6 that is connected to the word line driver circuit. The second contact and the third contact, and the first contact and the fourth contact are all connected at least through the second interconnect layer 400 located between the first semiconductor structure and the second semiconductor structure.

Herein, the first contact may be understood as the word line connection structure 108 of FIG. 7; the second contact may be understood as the bit line connection structure 112 of FIG. 7; the third contact may be understood as a portion in the front side metal interconnect layer of FIG. 7 that is connected to the sensing amplifier circuit; and the fourth contact may be understood as a portion in the front side metal interconnect layer of FIG. 7 that is connected to the word line driver circuit. The second contact and the third contact, and the first contact and the fourth contact are all connected through the bonding interconnect structure 500 located between the first semiconductor structure and the second semiconductor structure. In some examples, at least one of the first contact or the second contact may be located on an edge of the memory cell array, or may also be located right below the memory cell array.

In some examples, the first semiconductor structure 100 further comprises a fifth contact connected with the capacitor C; the fifth contact is disposed on a side close to the second semiconductor structure; the second semiconductor structure 200 further comprises a sixth contact connected with a common electrode; the sixth contact is disposed on a side close to the first semiconductor structure; and the fifth contact and the sixth contact are connected through an interconnect layer located between the first semiconductor structure and the second semiconductor structure. In some examples, the fifth contact may be located on the edge of the memory cell array.

Referring to FIGS. 6 and 7, as well as FIG. 5B, in some examples, the second semiconductor structure comprises a plurality of active regions spaced apart by isolation regions; and the connection structures are disposed at boundaries of the active regions and in the isolation regions.

In some examples, the first substrate 202 of the second semiconductor structure 200 comprises first insulation structures 206 separating the plurality of active regions, and the connection structures 204 may be disposed in the first insulation structures 206; and/or the first substrate 202 of the second semiconductor structure 200 further comprises second insulation structures 208 separating a plurality of well regions (P wells/N wells), and the connection structures 204 may be disposed in the second insulation structures 208. Materials and positions of the first insulation structure 206 and the second insulation structure 208 have been mentioned above, and thus are not described herein again.

Herein, by arranging the connection structures 204 at boundaries of the active regions and in the isolation regions, the connection structures penetrating through the first substrate may be prevented from damaging the first control circuit or partial structure of the at least part of the peripheral circuit that is located in the first substrate.

Referring to FIGS. 6 and 7, in some examples, the memory device further comprises a power supply wire, wherein the power supply wire is disposed in the first interconnect layer.

In some examples, part of the metal interconnect line (e.g., a $4^{th}$ level metal layer 304 shown in FIGS. 6 and 7) of the first interconnect layer 300 is used as the power supply wire, and the power supply wire is connected with a routing layer corresponding to the at least part of the peripheral circuit through the contact (e.g., a $4^{th}$ level contact 303 shown in FIGS. 6 and 7). Part of the metal interconnect line (e.g., the $3^{rd}$ level metal layer 302 shown in FIGS. 6 and 7) of the first interconnect layer 300 is used as the routing layer of the peripheral circuit, and the routing layer of the peripheral circuit is connected with the at least part of the peripheral circuit PC through the contact (e.g., the connection structure 204 shown in FIGS. 6 and 7).

It is to be noted that, in some other examples, positions of the power supply wire and the routing layer of the peripheral circuit may be interchanged up and down. In some other examples, the power supply wire and the routing layer of the peripheral circuit may also be distributed in different positions of the same metal layer. In conclusion, a positional relationship between the power supply wire and the routing layer of the peripheral circuit is not limited in the examples of the present application.

It can be understood that, by supplying power to the back side of the second semiconductor structure, a distance of a power supply from the peripheral circuit and a first circuit is closer, such that a routing voltage drop is smaller, thereby achieving a higher utilization rate of the power supply. Meanwhile, a metal layer on the back side of the second semiconductor structure for interconnect of the peripheral circuit and a metal layer for power bus layout may share part of the metal layers, such that a total number of metal layers on the front side and the back side can be reduced, thereby saving process cost, and reducing sizes occupied by the metal layers.

In some examples, the second semiconductor structure further comprises: a plurality of second control circuits, each connected with one memory bank; the second control circuits are distributed in gaps of the plurality of first control circuits; and the second control circuit comprises a row decoding circuit and a column decoding circuit.

Herein, the second control circuit is a control circuit corresponding to the memory bank, such as the column decoding circuit, and the row decoding circuit, etc. described above. Each memory bank corresponds to one group of column decoding circuits and row decoding circuits. In addition to placing the peripheral circuit in the aforementioned vacant region, the column decoding circuit and row decoding circuit are also placed in a corresponding position below the memory bank.

In some examples, a boundary of a region in which the second control circuit is disposed overlaps with a boundary of a gap between the adjacent memory banks.

Herein, considering the convenience of routing, the group of column decoding circuits and row decoding circuits corresponding to each memory bank may be arranged next to the corresponding position below the respective memory bank. For example, by disposing the second control circuit in a corresponding position below the gap between the adjacent memory banks, the boundary of the region in which the second control circuit is disposed overlaps with the boundary of the gap between the adjacent memory banks. In this way, extra areas brought by the second control circuit can be reduced, thereby further increasing the storage density of the memory device.

Referring to FIGS. 6 and 7, in some examples, the memory device further comprises a pad, wherein the pad is located on a side of the first interconnect layer that is away from the second semiconductor structure, and is electrically connected with the first interconnect layer.

Herein, the pad 306 may be located on the first interconnect layer, and is electrically connected with the first interconnect layer. In an example, the pad 306 may be configured to serve as a lead-out pad of the memory device, such that the memory device is electrically connected with an external device through the lead-out pad. A material of the pad 306 may be understood with reference to the material of the aforementioned $4^{th}$ level metal layer 304. For example, the material of the pad 306 comprises a metal material that is easily patterned by direct lithography such as aluminum or aluminum alloy, etc., or may also comprise a metal material with good conductivity such as copper or copper alloy etc.

Referring to FIGS. 6 and 7, in some examples, the memory cell array comprises: a plurality of word lines WL extending along a first direction; a plurality of bit lines BL extending along a second direction; and a plurality of semiconductor pillars arranged in an array, and a storage structure corresponding to each of the plurality of semiconductor pillars, wherein the semiconductor pillar and the corresponding storage structure are stacked; the semiconductor pillar extends along a third direction, and is provided with a first end and a second end oppositely arranged in the third direction; the first end is connected with the bit line, and the second end is connected with the storage structure; the word line is coupled with at least one side of the semiconductor pillar; and the third direction is perpendicular to both the first direction and the second direction.

Herein, the semiconductor pillar may be understood as a channel structure of an array transistor TA of FIG. 6 or FIG. 7. The storage structure may be understood as the capacitor C of FIG. 6 or FIG. 7.

In the examples of the present application, the semiconductor pillar extends along the third direction, i.e., the channel structure of an array transistor extends along the third direction, and the array transistor is used as a vertical transistor, facilitating a reduction in a size of the array transistor; and the array transistor and the storage structure are stacked along the third direction, and a unit memory cell area of the memory cell array may be 4 cell array areas (i.e., 4F2), such that an integration level of the memory device can be improved.

Referring to FIGS. 6 and 7, in some examples, the storage structure comprises a capacitor; and the capacitor C comprises a cup-shaped capacitor, a cylindrical capacitor, or a pillar-shaped capacitor. In an example, the cup-shaped capacitor, the cylindrical capacitor, and the pillar-shaped capacitor all comprise bottom electrodes, top electrodes, and dielectric layers located between the bottom electrodes and the top electrodes. It is to be noted that, a bottom electrode of one capacitor is connected with a source of one array transistor; the top electrodes of the capacitors are all connected with the common electrode and are configured to be grounded; and the capacitors are configured to store written data.

It is to be noted that, when the bottom electrodes in the cup-shaped capacitor, the cylindrical capacitor, and the pillar-shaped capacitor have a same area, the top electrode of the cylindrical capacitor has the largest area, followed by the top electrodes of the cup-shaped capacitor and the pillar-shaped capacitor. Based on this, in some examples, the cylindrical capacitor may be employed as the memory cell of a memory, thereby improving the integration level of the memory device.

Figure 13A:
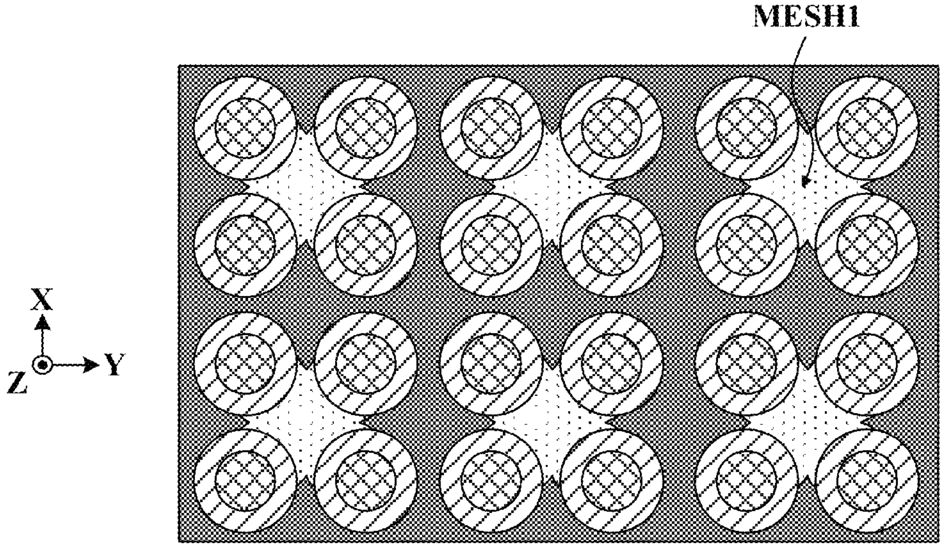
FIG. 13A is a plan layout I of a storage structure of a memory device provided by examples of the present application.
Figure 13B:
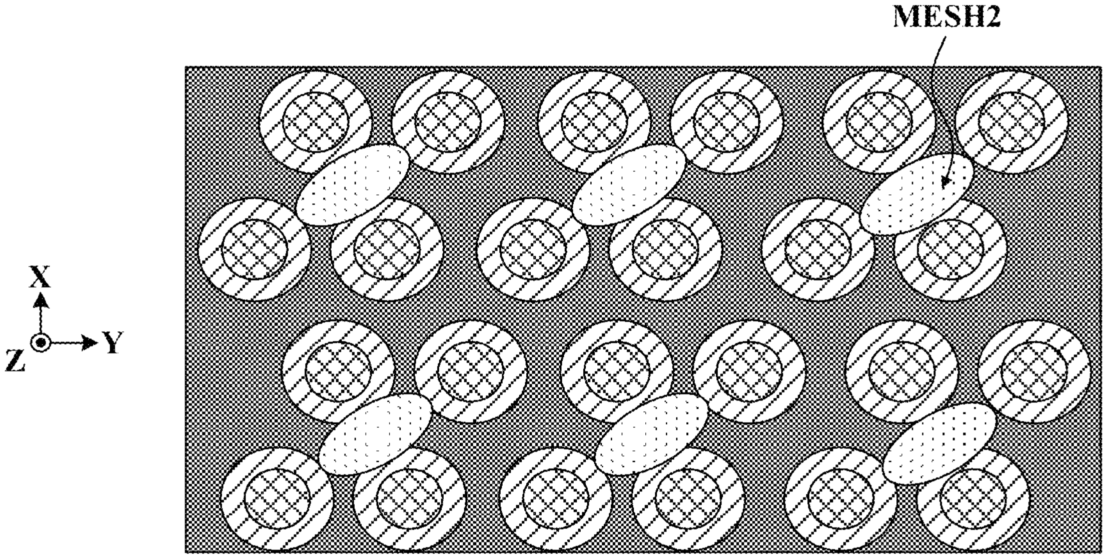
FIG. 13B is a plan layout II of a storage structure of a memory device provided by examples of the present application.

In some examples, the plurality of storage structures are arranged in a square shape or arranged in a hexagonal shape. In an example, referring to FIG. 13A, in an X-Y top view plane, an array layout of the plurality of storage structures may be in a square arrangement, and a gap among four storage structures arranged in a square is a first gap MESH1. In an example, referring to FIG. 13B, in the X-Y top view plane, an array layout of the plurality of storage structures may be in a hexagonal arrangement, and a gap among four storage structures arranged in a hexagon is a second gap MESH2. In a practical application, the plurality of storage structures may also be arranged in other arrays other than the square arrangement and the hexagonal arrangement. Compared to the square arrangement of the plurality of storage structures, the plurality of storage structures in the hexagonal arrangement have a higher arrangement density, for example, the second gap MESH2 is less than the first gap MESHI, such that the integration level of the memory device is improved.

Figure 10A:
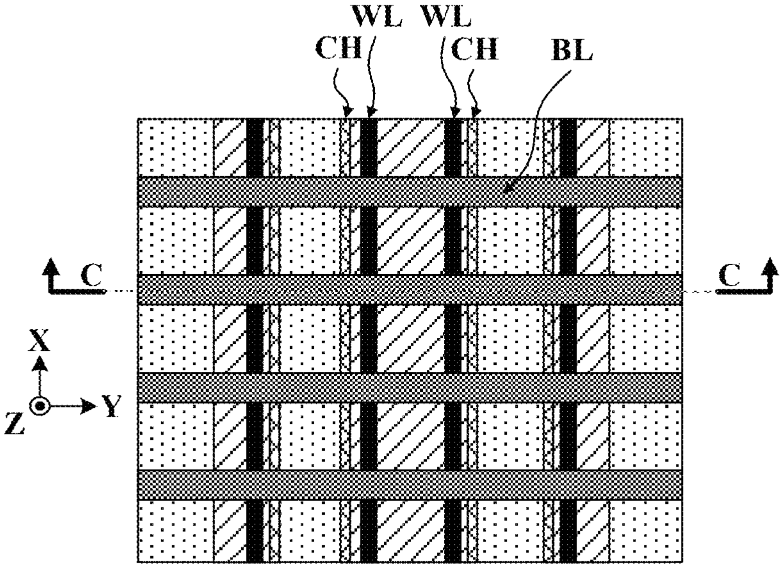
FIG. 10A is a plan layout I of a memory cell array of a memory device provided by examples of the present application.
Figure 10B:
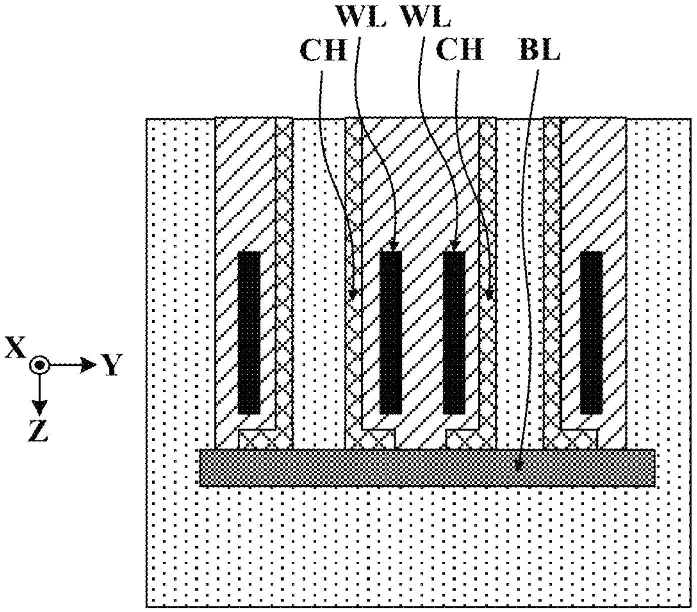
FIG. 10B is a schematic diagram of a cross section taken along C-C in FIG. 10A.
Figure 11A:
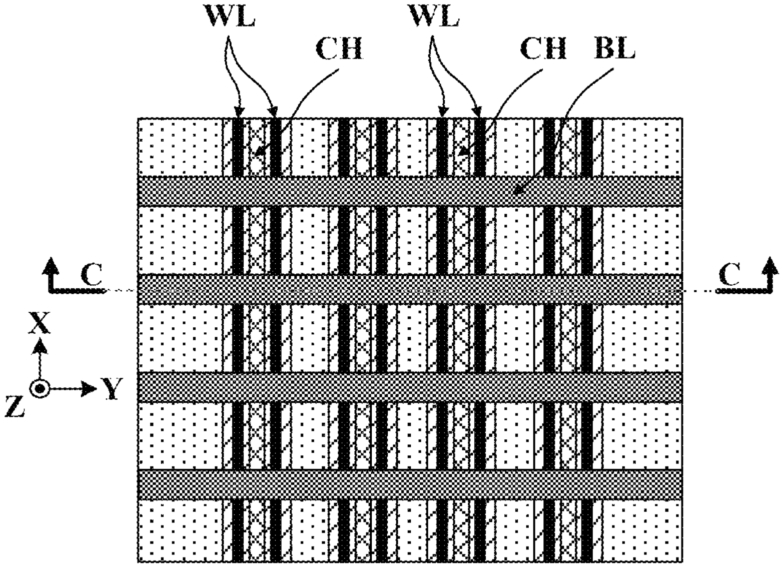
FIG. 11A is a plan layout II of a memory cell array of a memory device provided by examples of the present application.
Figure 11B:
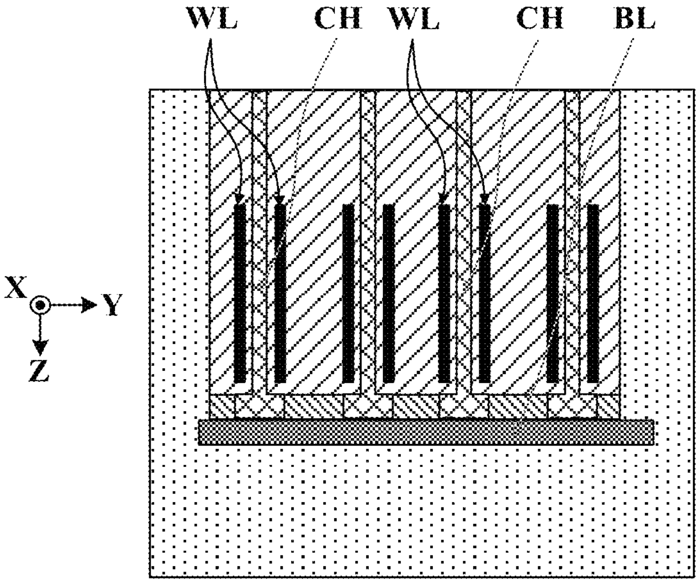
FIG. 11B is a schematic diagram of a cross section taken along C-C in FIG. 11A.
Figure 12A:
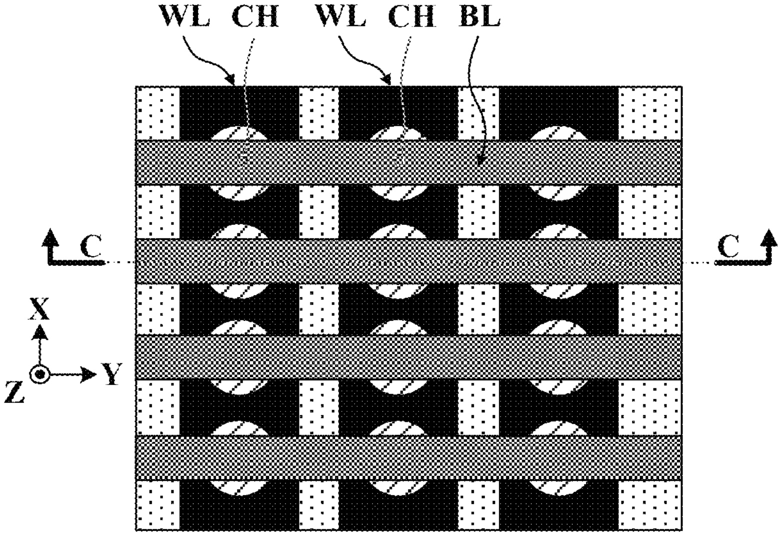
FIG. 12A is a plan layout III of a memory cell array of a memory device provided by examples of the present application.
Figure 12B:
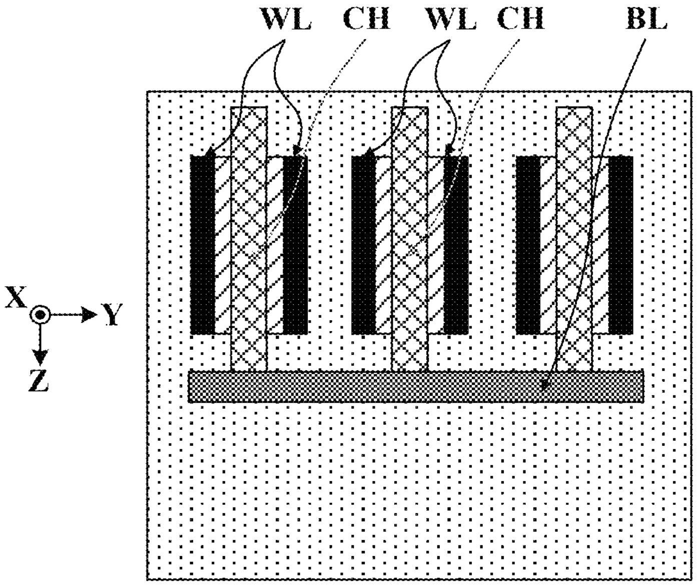
FIG. 12B is a schematic diagram of a cross section taken along C-C in FIG. 12A.

In some examples, referring to FIGS. 10A and 10B, the word line WL is coupled with one side of the semiconductor pillar CH to constitute a single-side gate structure; or referring to FIGS. 11A and 11B, the word line WL is coupled with two opposite sides of the semiconductor pillar CH to constitute a double-side gate structure; or referring to FIGS. 12A and 12B, the word line WL is coupled with various sides of the semiconductor pillar CH to constitute a gate-all-around structure.

In some examples, a material of the semiconductor pillar CH may comprise at least one of indium gallium zinc oxide, indium zinc oxide, gallium zinc oxide, indium gallium oxide, zinc oxide, indium oxide, or gallium oxide. In some examples, the material of the semiconductor pillar CH comprises the indium gallium zinc oxide.

It can be understood that, the indium gallium zinc oxide has the characteristics of being high in mobility, good in uniformity, low in power consumption, and low in noise, such that a transistor formed by employing the semiconductor pillar CH comprising the indium gallium zinc oxide has high field effect mobility and a high threshold voltage, and thus has more excellent performance. Furthermore, the indium gallium zinc oxide may be directly prepared through processes such as deposition, and is easy to process.

In a second aspect, examples of the present application provide another memory device. Referring to FIG. 6, the memory device comprises: a first semiconductor structure 100 comprising a memory cell array; a second semiconductor structure 200 comprising at least a plurality of first control circuits and at least part of the peripheral circuit distributed at gaps of the plurality of first control circuits; a first interconnect layer 300 located on a side of the second semiconductor structure that is away from the first semiconductor structure; a plurality of connection structures 204 penetrating through part of the second semiconductor structure, wherein one end is connected with the at least part of the peripheral circuit at the gaps, and the other end is connected with the first interconnect layer; and a second interconnect layer 400 located between the first semiconductor structure 100 and the second semiconductor structure 200, and connected with both the memory cell array and the first control circuit.

Details for the plan layout of the memory device shown in FIG. 6 may be understood with reference to FIGS. 4A, 4B, 5A, and 5B. In some examples, the memory cell array comprises a plurality of memory banks, and the memory bank comprises a plurality of memory blocks; one first control circuit is connected with one memory block, and the peripheral circuit is connected with all the memory banks; at least part of the peripheral circuit comprises a plurality of first portions PC1 and one second portion PC2; a boundary of a region in which one first portion PC1 and the first control circuit connected with one respective memory block arc disposed overlaps with a boundary of a region in which the respective memory block is disposed; a boundary of a region in which the second portion PC2 is disposed overlaps with a boundary of a gap between the adjacent memory blocks; and at least one of the second portion or the plurality of first portions is connected with the first interconnect layer through the plurality of connection structures.

In some examples, the memory device further comprises a power supply wire, wherein the power supply wire is disposed in the first interconnect layer 300.

In the examples of the present application, through the stacking arrangement of the first semiconductor structure and the second semiconductor structure, a storage density of the memory device can be significantly increased; through the utilization of routing on the back side of the second semiconductor structure, and by connecting same to at least part of the peripheral circuit through the connection structure, the at least part of the peripheral circuit is scattered below the memory block of the memory cell array, such that areas occupied by the peripheral circuit in the second semiconductor structure are directly reduced; and the routing on the back side of the second semiconductor structure can realize the interconnects among the at least part of the peripheral circuit scattered, without conflicting with the connection of routing on the front side of the second semiconductor structure; and at the same time, the first semiconductor structure and the second semiconductor structure are both grown and formed on the first substrate, such that the use of a growth substrate can be reduced, so as to save cost.

In a third aspect, examples of the present application provide still another memory device. Referring to FIG. 7, the memory device comprises: a first semiconductor structure 100 comprising a memory cell array; a second semiconductor structure 200 comprising at least a plurality of first control circuits and at least part of the peripheral circuit distributed at gaps of the plurality of first control circuits; a first interconnect layer 300 located on a side of the second semiconductor structure that is away from the first semiconductor structure; and a third interconnect layer, a first bonding layer, a second bonding layer, and a fourth interconnect layer (the third interconnect layer, the first bonding layer, the second bonding layer, and the fourth interconnect layer may be called bonding interconnect structures 500 for short), which are stacked, located between the first semiconductor structure and the second semiconductor structure, and all connected with the memory cell array and the first control circuit.

Details for the plan layout of the memory device shown in FIG. 7 may also be understood with reference to FIGS. 4A, 4B, 5A, and 5B. In some examples, the memory cell array comprises a plurality of memory banks, and the memory bank comprises a plurality of memory blocks; one first control circuit is connected with one memory block, and the peripheral circuit is connected with all the memory banks; the at least part of the peripheral circuit comprises a plurality of first portions PC1 and one second portion PC2; a boundary of a region in which one first portion PC1 and the first control circuit connected with one respective memory block are disposed overlaps with a boundary of a region in which the respective memory block is disposed; a boundary of a region in which the second portion PC2 is disposed overlaps with a boundary of a gap between the adjacent memory blocks; and at least one of the second portion or the plurality of first portions is connected with the first interconnect layer through the plurality of connection structures.

In some examples, the memory device further comprises a power supply wire, wherein the power supply wire is disposed in the first interconnect layer.

In various examples of the present application, through the stacking arrangement of the first semiconductor structure and the second semiconductor structure, a storage density of the memory device can be significantly increased; through the utilization of routing on the back side of the second semiconductor structure, and by connecting same to at least part of the peripheral circuit through the connection structure, at least part of the peripheral circuit is scattered below the memory block of the memory cell array, such that areas occupied by the peripheral circuit in the second semiconductor structure are directly reduced; and the routing on the back side of the second semiconductor structure can realize the interconnects among the at least part of the peripheral circuit scattered, without conflicting with the connection of routing on the front side of the second semiconductor structure; and at the same time, the first semiconductor structure and the second semiconductor structure are respectively grown and manufactured by employing different substrates, such that the problem of mutual restriction between a manufacturing process of the memory cell array and a manufacturing process of the peripheral circuit can be solved to shorten a development cycle of the memory device.

Figure 14:
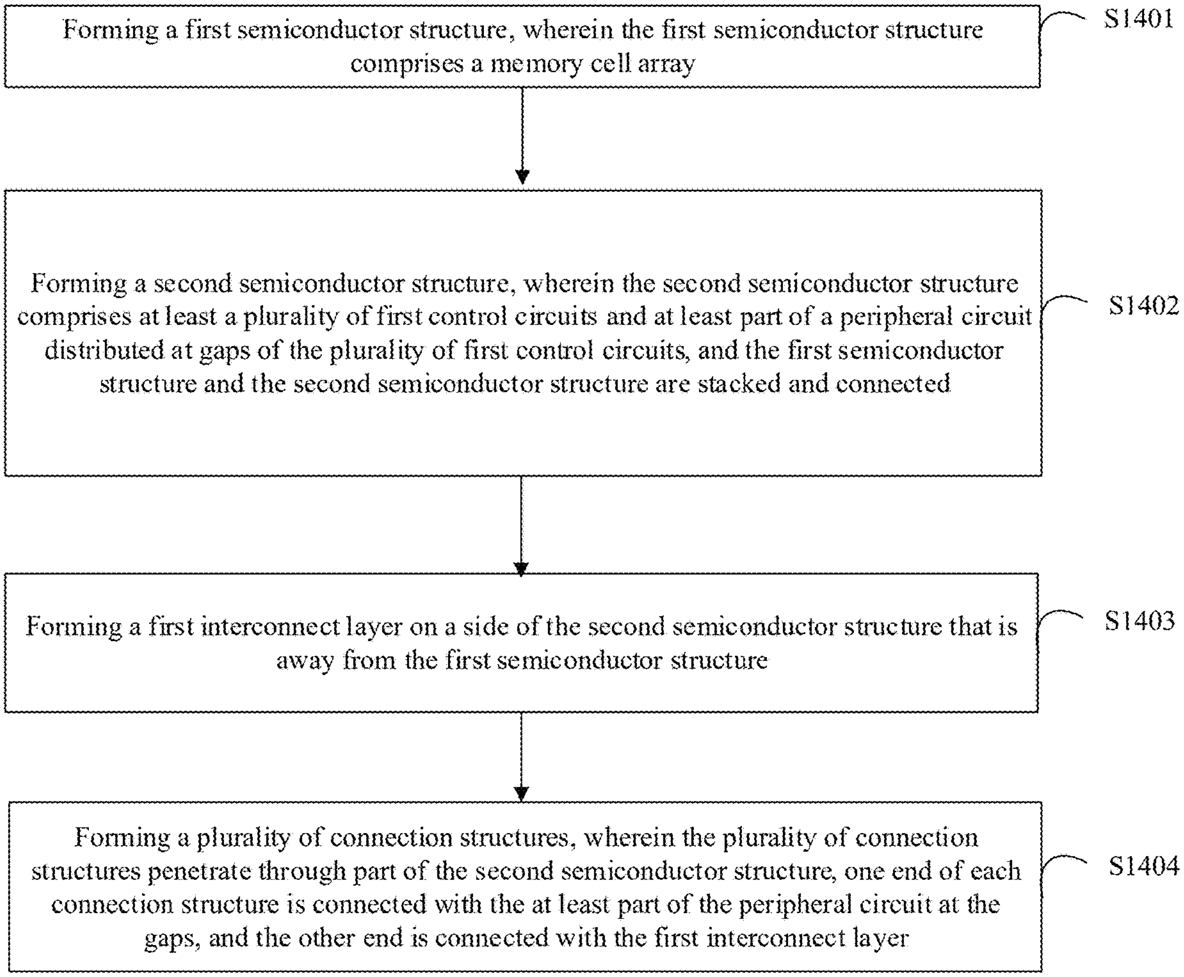
FIG. 14 is a flow diagram of a manufacturing method of a memory device provided by examples of the present application.

In a fourth aspect, examples of the present application provide a manufacturing method of a memory device. Referring to FIG. 14, FIG. 14 is a flow diagram of a manufacturing method of a memory device provided by examples of the present application. The method comprises:

- operation S1401: forming a first semiconductor structure, wherein the first semiconductor structure comprises a memory cell array;
- operation S1402: forming a second semiconductor structure, wherein the second semiconductor structure comprises at least a plurality of first control circuits and at least part of peripheral circuit distributed at gaps of the plurality of first control circuits, and the first semiconductor structure and the second semiconductor structure are stacked and connected;
- operation S1403: forming a first interconnect layer on a side of the second semiconductor structure that is away from the first semiconductor structure; and
- operation S1404: forming a plurality of connection structures, wherein the plurality of connection structures penetrate through part of the second semiconductor structure, one end of each connection structure is connected with the at least part of the peripheral circuit at the gaps, and the other end is connected with the first interconnect layer.

It is to be understood that, the operations shown in FIG. 14 are not exclusive, and additional operations may also be performed before and after any operation or between any operations in the shown operations. A sequence of the operations shown in FIG. 14 may be adjusted according to actual requirements. As described above, there may be various relative positions between a gate (word line) and the semiconductor pillar in the memory device, and detailed manufacturing methods corresponding to different relative positions are different. In the examples of the present application, description is performed by using an example that two gates corresponding to two adjacent semiconductor bodies are arranged back-to-back, respectively (the back-to-back arrangement is shown in FIGS. 10A and 10B).

There are various methods of forming the first semiconductor structure, the second semiconductor structure, the first interconnect layer, and the connection structure, and several method examples are shown in the examples of the present application. Formation processes of the first semiconductor structure, the second semiconductor structure, the first interconnect layer, and the connection structure are described below in detail with reference to the drawings.

In the process of performing operation S1401 to operation S1404, in some examples, forming the first semiconductor structure, the second semiconductor structure, and the first interconnect layer comprises: forming the second semiconductor structure on a first surface of a first substrate; forming a second interconnect layer on the second semiconductor structure; forming the first semiconductor structure on the second interconnect layer, wherein the first semiconductor structure and the second semiconductor structure are connected through the second interconnect layer; and forming the first interconnect layer on a second surface of the first substrate, wherein the first surface and the second surface are two surfaces arranged opposite to each other along a thickness direction of the first substrate.

In some examples, forming the first semiconductor structure comprises: forming a plurality of bit lines extending along a second direction; forming a plurality of semiconductor pillars on surfaces of the bit lines, wherein the semiconductor pillars extend along the thickness direction of the first substrate; forming a plurality of word lines extending along a first direction, wherein the word line is located on at least one side of the semiconductor pillar, and the first direction and the second direction are both perpendicular to the thickness direction of the first substrate; and forming a storage structure on a surface of each semiconductor pillar that is away from the bit line.

In some examples, the method further comprises: providing a third substrate; bonding the third substrate on the storage structure to form a bonding structure; turning over the bonding structure to expose the second surface of the first substrate; and forming the first interconnect layer on the second surface of the first substrate, and then removing the third substrate.

Figure 15A:
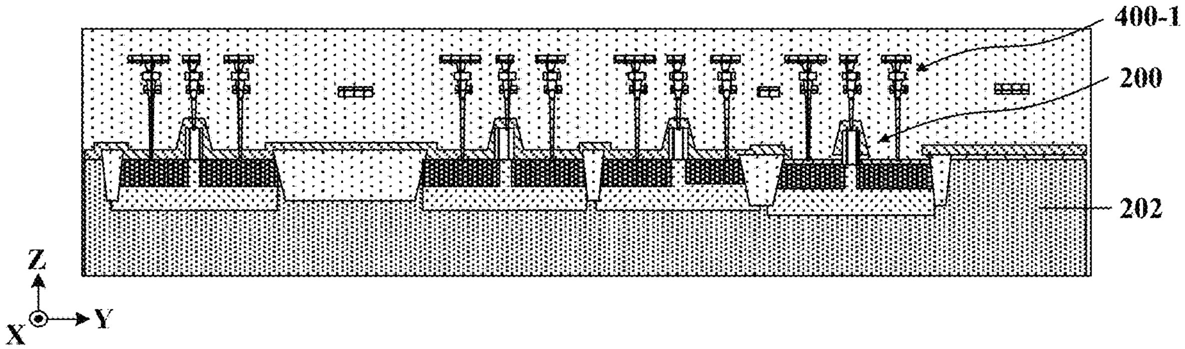
FIGS. 15A to 15K are schematic cross-sectional views I of a process of forming a memory device provided by examples of the present application.
Figure 15B:
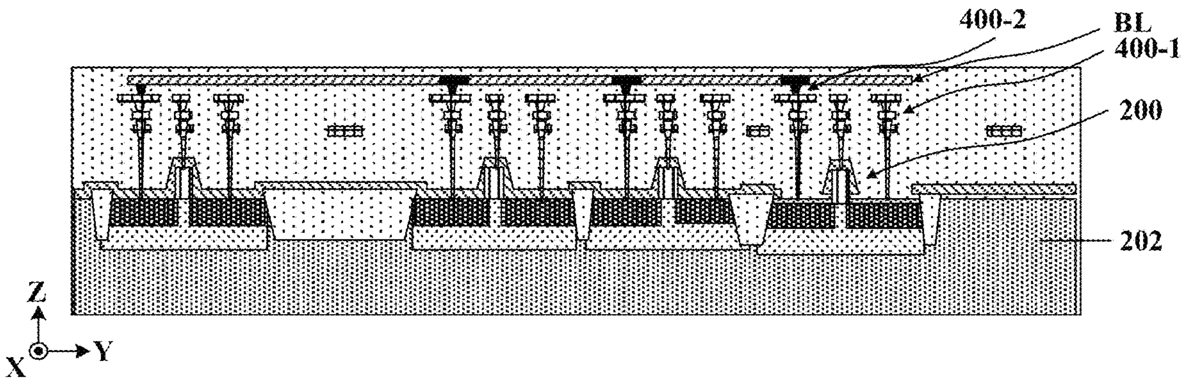
Figure 15C:
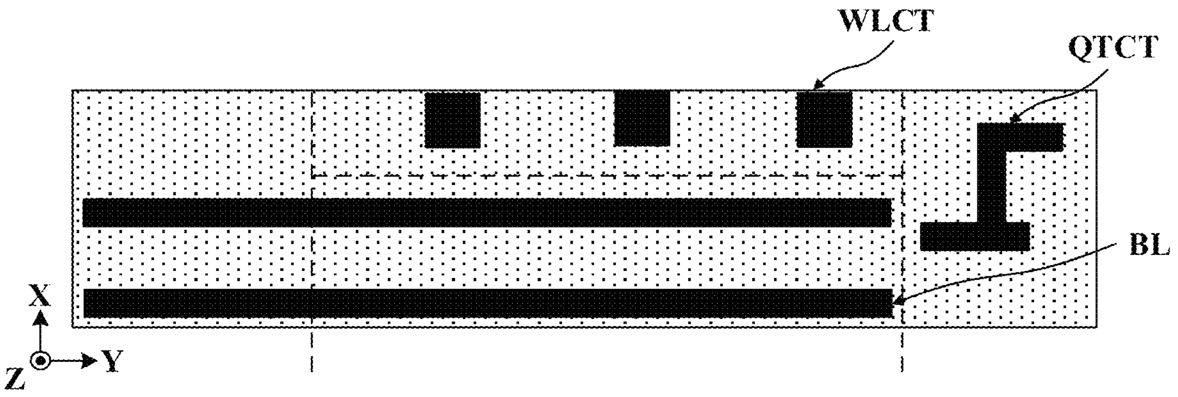

FIGS. 15A to 15K are schematic cross-sectional views I of a process of forming a memory device provided by examples of the present application. It is to be noted that, FIG. 15C is a schematic top view corresponding to a stage of FIG. 15B; and a formation process of the memory device is described below in detail with reference to the drawings.

Referring to 15A, the first substrate 202 is provided, and the second semiconductor structure 200 is formed on the first surface of the first substrate 202. In some examples, the first substrate 202 may comprise a substrate of a semiconductor material such as silicon, germanium, silicon germanium, etc. In some other examples, the first substrate 202 may also be a silicon on insulator or a germanium on insulator. In some examples, the first substrate 202 has two surfaces arranged opposite to each other along a Z direction, the first surface may be a front side of the first substrate 202, and the second surface may be a back side of the first substrate 202.

The second semiconductor structure 200 comprises at least a plurality of first control circuits and at least part of the peripheral circuit distributed at gaps of the plurality of first control circuits. In some examples, the second semiconductor structure 200 further comprises a plurality of second control circuits. The peripheral circuit, the first control circuit, and the second control circuit may all be understood with reference to the aforementioned descriptions for these circuits, and specific compositions and formation positions of the second semiconductor structure 200 are described in detail.

In some examples, the memory cell array comprises a plurality of memory banks, and the memory bank comprises a plurality of memory blocks; one first control circuit is connected with one memory block, and the peripheral circuit is connected with all the memory banks; and at least part of the peripheral circuit comprises a plurality of first portions and one second portion. Forming the at least part of the peripheral circuit comprises: forming one first portion and one first control circuit at a position in the second semiconductor structure that overlaps with a region in which each memory block is disposed; and forming the second portion at a position in the second semiconductor structure that overlaps with a gap between the adjacent memory blocks, wherein at least one of the first portion or the second portion is connected with the first interconnect layer through the plurality of connection structures.

In some examples, the first control circuit comprises a sensing amplifier circuit and a word line driver circuit; the sensing amplifier circuit is connected with a bit line in the memory block; and the word line driver circuit is connected with a word line in the memory block.

In some examples, forming the second semiconductor structure comprises: forming the sensing amplifier circuit in a first region and a second region; and forming the word line driver circuit in a third region and a fourth region, wherein the first region and the second region both extend along a first direction and are staggered along a second direction, the third region and the fourth region both extend along the second direction and are staggered along the first direction, the first direction is perpendicular to a direction in which the bit line extends, and the second direction is perpendicular to a direction in which the word line extends.

In some examples, a boundary of the first region is in contact with a boundary of the third region, and a boundary of the second region is in contact with a boundary of the fourth region; and a sum of sizes of the boundary of the first region and the boundary of the third region along the first direction is a first size, a size, along the first direction, of the boundary of the region in which the memory block is disposed is a second size, and the first size is less than the second size.

In some examples, the second semiconductor structure further comprises a plurality of second control circuits; and one second control circuit is connected with one memory bank. Forming the second semiconductor structure further comprises: forming at least part of the peripheral circuit and the plurality of second control circuits in gaps of the plurality of first control circuits, wherein the second control circuit comprises a row decoding circuit and a column decoding circuit. In some examples, forming the second control circuit comprises: forming the second control circuit in a position in the second semiconductor structure that overlaps with a gap between the adjacent memory banks.

In some examples, a process of forming the second semiconductor structure 200 may comprise: forming a P-type well region (PWell) and an N-type well region (NWell) on the first substrate 202, performing n doping in the PWell, and performing doping in the NWell, respectively, so as to form a semiconductor doping region required; and then forming a gate on a substrate surface to obtain the peripheral circuit, first control circuit, and second control circuit comprising peripheral transistors.

Continuously referring to FIG. 15A, one portion 400-1 of the second interconnect layer is formed on the second semiconductor structure 200. In some examples, the portion 400-1 of the second interconnect layer may comprise one or more metal layers and contacts of the respective metal layers (a $3^{rd}$ level metal layer and a $3^{rd}$ level contact are shown in FIG. 15A). The portion 400-1 of the second interconnect layer is at least configured to connect the transistors in the first control circuit and configured to lead out sources, drains, and gates of the transistors comprised in the first control circuit and the peripheral circuit. The portion 400-1 of the second interconnect layer comprises a third contact connected with the sensing amplifier circuit and a fourth contact connected with the word line driver circuit.

Referring to FIG. 15B, the other portion 400-2 of the second interconnect layer and the bit line BL in the first semiconductor structure are continuously formed on the second semiconductor structure 200. The bit line BL extends along the second direction, i.e., a Y direction. The portion 400-1 and the other portion 400-2 of the second interconnect layer together form the second interconnect layer 400.

In some examples, the other portion 400-2 of the second interconnect layer may comprise a word line contact (i.e., a first contact), a bit line contact (i.e., a second contact) (only the bit line contact can be seen in FIG. 15B), a capacitor common electrode contact, etc.

In some examples, the manner of forming the second interconnect layer and the bit line includes, but is not limited to, first utilizing an etching process to form a trench, and then utilizing a deposition process to form the metal layers and various contacts.

Referring to FIG. 15C, the plurality of bit lines BL all extends along the second direction, i.e., the Y direction, and are arranged at intervals along the first direction. The word line contact WLCT is located on one side of the bit line and does not interfere with the bit line; and other contacts QTCTs may be located on other sides of the bit line and do not interfere with the bit line and the word line contact. It is to be noted that, FIG. 15C is not a view corresponding to FIG. 15B along the Z direction, and is only a view of a manufacturing stage corresponding to FIG. 15B along the Z direction. A positional relationship among the bit line, the word line contact, and other contacts shown in FIG. 15C is for example only, and is not used to limit a positional relationship among the bit line, the word line contact, and other contacts in the examples of the present application.

Figure 15D:
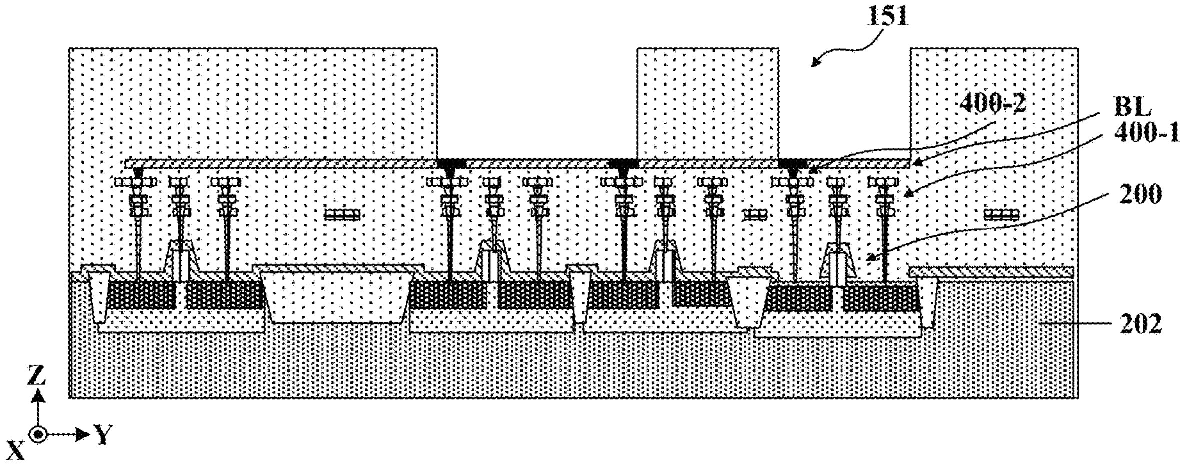

Referring to FIG. 15D, first dielectric layers are formed on a surface of the bit line BL, and first grooves 151 are formed in the first dielectric layers, and the first grooves 151 are arranged in an array along the first direction and the second direction. In some examples, a material of the first dielectric layer includes, but is not limited to, silicon oxide; and the manner of forming a dielectric layer includes, but is not limited to, the deposition process, which, in an example, may be physical vapor deposition, chemical vapor deposition, etc. In some examples, the manner of forming the first groove 151 includes, but is not limited to, a dry etching process.

Figure 15E:
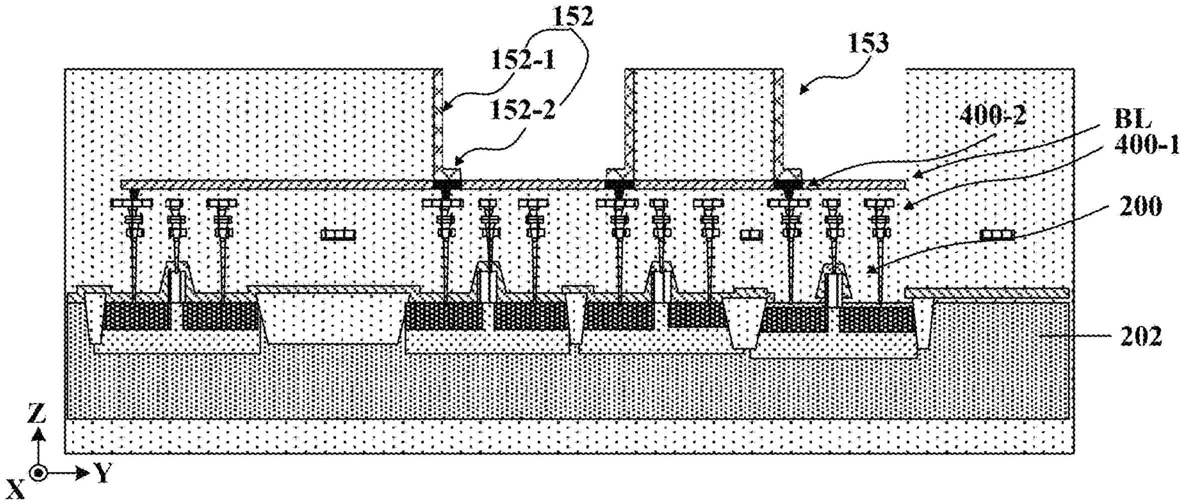

Referring to FIG. 15E, semiconductor material layers are formed on sidewalls and bottoms of the first grooves 151, at least part of the semiconductor material layers at the bottom are removed to expose the surface of the bit line, the remaining semiconductor material layers form semiconductor pillars 152, and the semiconductor pillar 152 may comprise a semiconductor body 152-1 extending along the Z direction, and optionally comprises a semiconductor accessory 152-2 extending along the Y direction. A second groove 153 is formed on the basis of the first groove 151 in which the semiconductor pillar 152 is formed; and the second groove 153 extends along an X direction.

In some examples, a material of the semiconductor material layer may comprise at least one of indium gallium zinc oxide, indium zinc oxide, gallium zinc oxide, indium gallium oxide, zinc oxide, indium oxide, or gallium oxide. The manner of forming the semiconductor material layer includes, but is not limited to, the deposition process. The manner of removing the at least part of the semiconductor material layers at the bottom and forming the second groove includes, but is not limited to, the dry etching process.

Figure 15F:
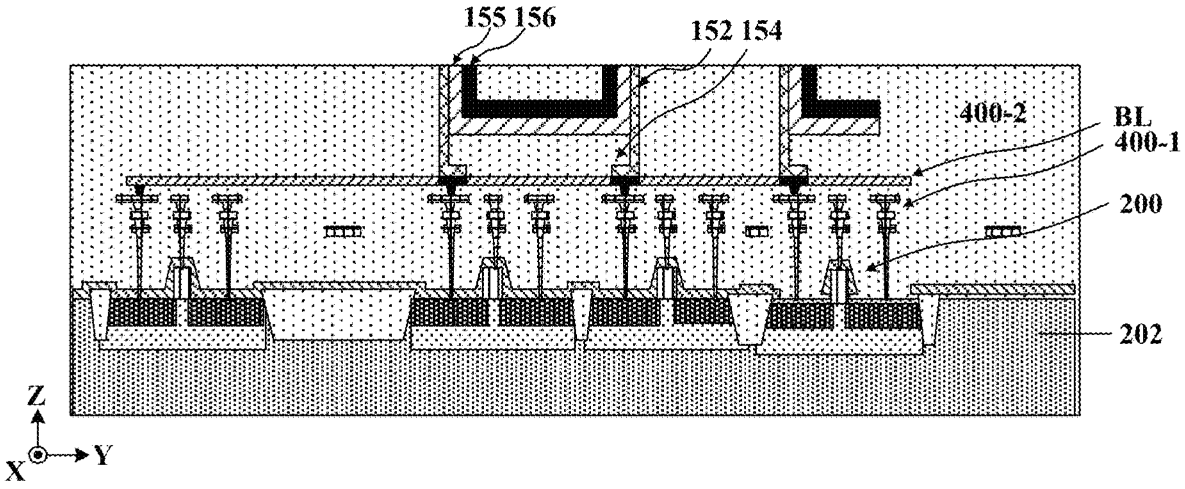

Referring to FIG. 15F, a dielectric material layer is formed in the second groove 153, a second dielectric layer 154 is formed by etching back the dielectric material layer, and a top side of the second dielectric layer 154 is lower than a top side of the semiconductor pillar 152. A gate dielectric material layer 155, a gate material layer 156, and the dielectric material layer are formed in sequence on the top side of the second dielectric layer 154 and a sidewall of the second groove 153.

In some examples, a material of the dielectric material layer includes, but is not limited to, silicon oxide; a material of the gate dielectric material layer 155 includes, but is not limited to, a high dielectric material; and a material of the gate material layer 156 includes, but is not limited to, tungsten. The manner of forming the dielectric material layer, the gate dielectric material layer 155, and the gate material layer 156 includes, but is not limited to, the deposition process.

Figure 15G:
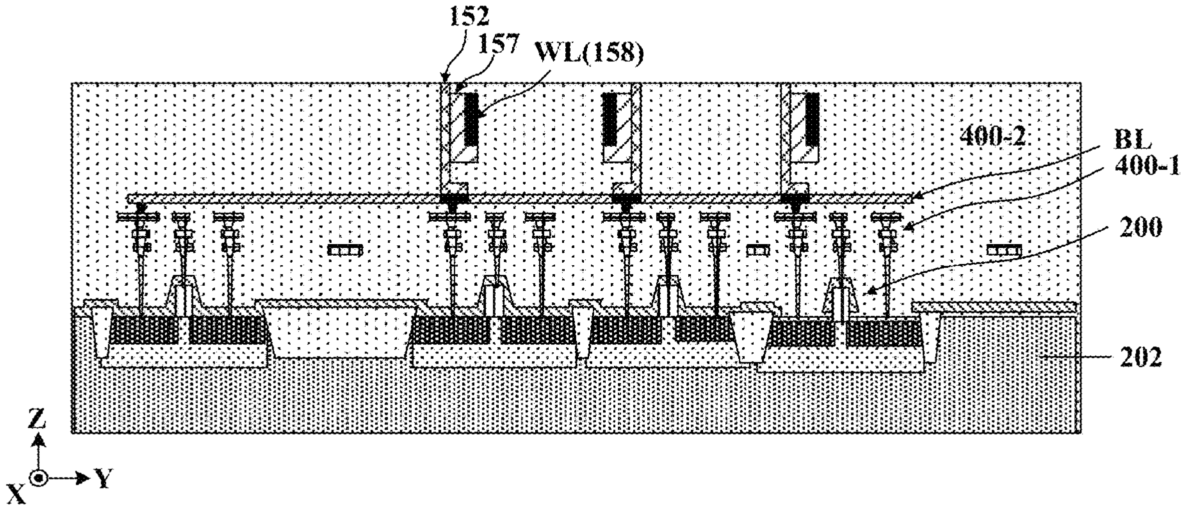

Referring to FIG. 15G, part of the gate dielectric material layer 155 and gate material layer 156 on the top side of the second dielectric layer 154 are removed, and part of the gate dielectric material layer 155 and gate material layer 156 covering a sidewall of the second groove are etched back to form a gate dielectric layer 157 and a gate 158, i.e., the word line WL; and the plurality of word lines extend along the first direction and are arranged at intervals along the second direction. A top side of the gate dielectric layer 157 and a top side of the gate 158 are lower than the top side of the semiconductor pillar 152. In some examples, the manner of removing the top side of the second dielectric layer 154 and etching back part of the gate dielectric material layer 155 and gate material layer 156 on the sidewall of the second groove includes, but is not limited to, dry etching.

It is to be noted that, some other manufacturing processes such as after forming the semiconductor pillar 152, doping two ends of the semiconductor pillar 152 that extend along the Z direction so as to form sources and drains are omitted herein. Based on this, the semiconductor pillar 152 is configured to form a transistor TA.

Figure 15H:
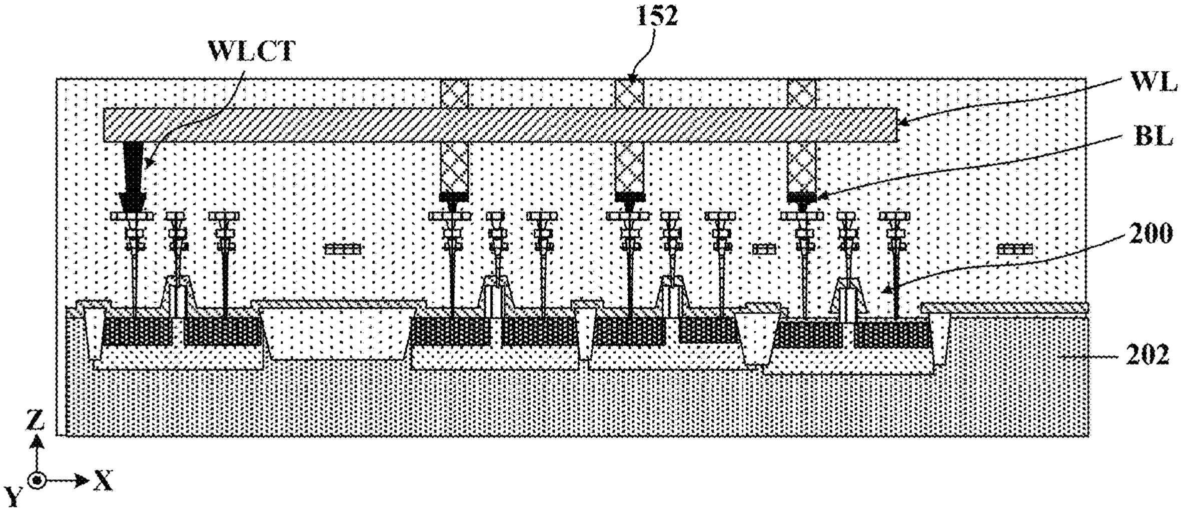
Figure 15I:
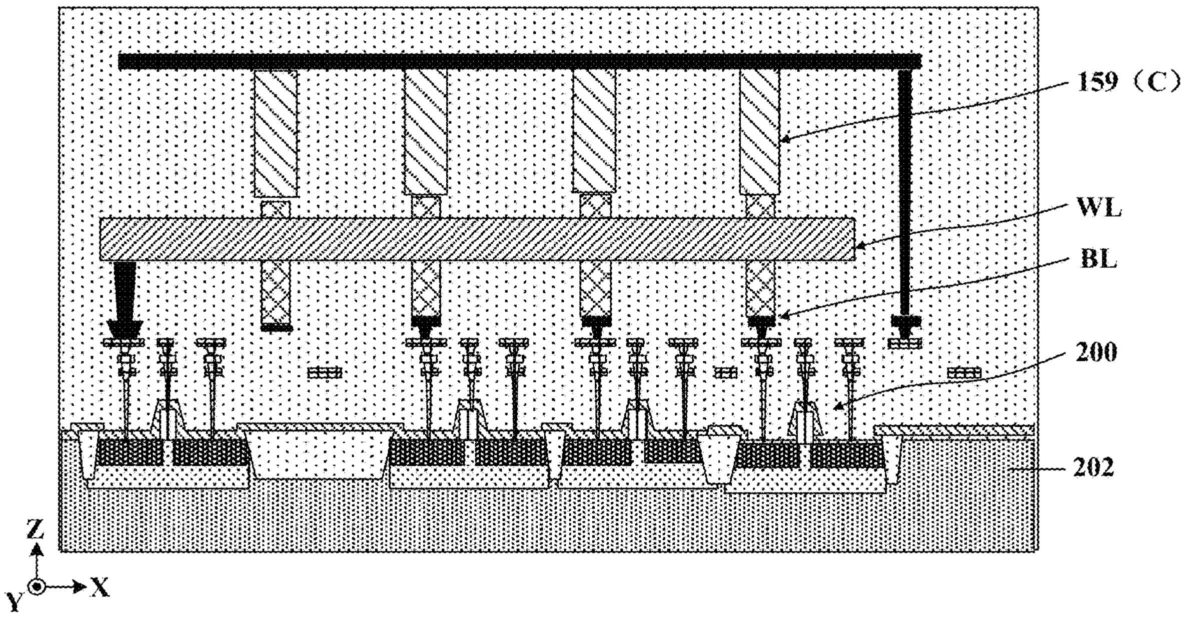

Referring to FIG. 15H, FIG. 15H is a cross-sectional view along a Z-X cross-section corresponding to FIG. 15G. The word line contact WLCT may be seen in FIG. 15H. Referring to FIG. 15I, a storage structure 159 is formed on a surface of each semiconductor pillar 152 that is away from the surface of the bit line. In some examples, the storage structure 159 may be a capacitor. In some examples, the capacitor comprises a capacitor; and the capacitor comprises a cup-shaped capacitor, a cylindrical capacitor, or a pillar-shaped capacitor. In some examples, the plurality of capacitors are arranged in a square shape or arranged in a hexagonal shape. A shape of the capacitor here may be understood with reference to a shape of the aforementioned capacitor; and the manner of forming the capacitor is relatively mature, and thus is no longer described herein again.

Figure 15J:
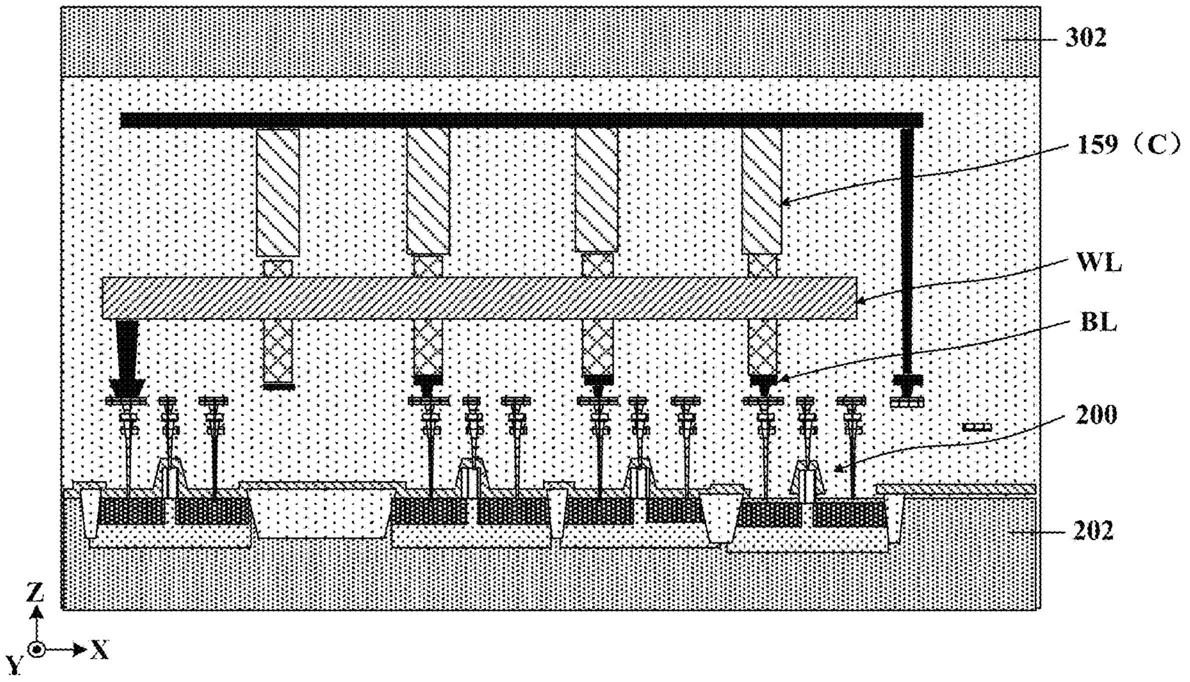

It is to be noted that, the number of semiconductor pillars 152 in FIGS. 15H and 15I is for example only, the drawings are only used to illustrate general appearance of various manufacturing processes, and the number of semiconductor pillars 152 shown therein may not be equivalently schematized. Referring to FIG. 15J, the dielectric material layer is filled, and the third substrate 302 is bonded to the dielectric material layer, so as to form a bonding structure. It is to be noted that, the third substrate 302 is configured to serve as a substrate for load carrying. The third substrate and the dielectric material layer may be firmly adhered, without the requirement of electrical connection.

Figure 15K:
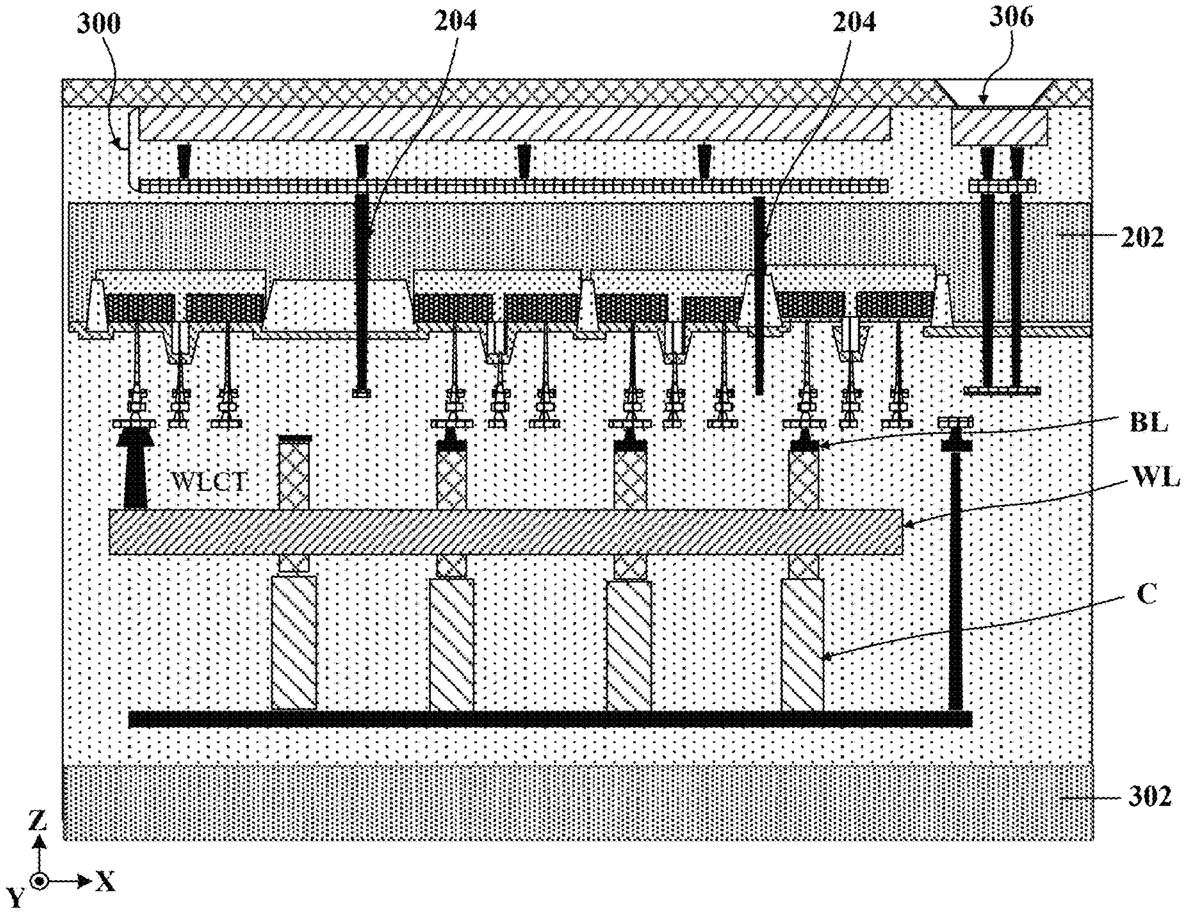

Referring to FIG. 15K, the bonding structure is turned over to expose the second surface of the first substrate 202, i.e., the back side of the first substrate, and the front side of the first substrate comprises a plurality of active regions spaced apart by isolation regions; and starting from the back side of the first substrate, connection structures 204 penetrating through the first substrate are formed at boundaries (which may be understood as edges of the active regions) of the active regions and in the isolation regions along the Z direction. Next, a first interconnect layer 300 is formed on the back side of the first substrate 202, and a routing layer configured to connect at least part of the peripheral circuit, and a power supply wire are formed in the first interconnect layer 300. A pad 306 electrically connected with the first interconnect layer is formed on a side of the first interconnect layer that is away from the second semiconductor structure. In some examples, the connection structure 204 may be completed by employing a through-silicon-via technology.

In some examples, the third substrate 302 may be selectively removed in subsequent manufacturing processes.

Herein, one manner of manufacturing the memory device is completed. In the manner, the first semiconductor structure and the second semiconductor structure are both grown and formed on the same substrate, i.e., first substrate 202, such that the use of a growth substrate can be reduced, so as to save cost.

In the process of performing operation S1401 to operation S1404, in some examples, forming the first semiconductor structure, the second semiconductor structure, and the first interconnect layer comprises: forming the second semiconductor structure on the first surface of the first substrate; forming a third interconnect layer and a first bonding layer, which are stacked, in sequence on the second semiconductor structure; forming the first semiconductor structure on a second substrate; forming a fourth interconnect layer and a second bonding layer, which are stacked, in sequence on the first semiconductor structure; bonding the first bonding layer and the second bonding layer, wherein the first semiconductor structure and the second semiconductor structure are connected through the third interconnect layer, the first bonding layer, the second bonding layer, and the fourth interconnect layer; and forming the first interconnect layer on the second surface of the first substrate, wherein the first surface and the second surface are two surfaces arranged opposite to each other along a thickness of the first substrate.

In some examples, forming the first semiconductor structure comprises: forming the plurality of storage structures on the second substrate; forming the semiconductor pillar on a surface of each storage structure that is away from a surface of the second substrate, wherein the semiconductor pillar extends along a thickness direction of the second substrate; forming the plurality of word lines extending along the first direction, wherein the word line is located on at least one side of the semiconductor pillar; and forming the bit line on the surface of the semiconductor pillar that is away from the storage structure, wherein the bit line extends along the second direction, and the first direction and the second direction are both perpendicular to the thickness direction of the second substrate.

FIGS. 16A to 16D are schematic cross-sectional views II of a process of forming a memory device provided by examples of the present application. The formation process of the memory device is described below in detail with reference to the drawings.

Referring to 16A, the first substrate 202 is provided, and the second semiconductor structure 200 is formed on the first surface of the first substrate 202. The first substrate 202 may be understood with reference to the aforementioned descriptions in FIG. 15A, and thus is not described herein again. Compositions of the second semiconductor structure 200, formation positions of various compositions, and formation manner may be understood with reference to the aforementioned descriptions in FIG. 15A, and thus are not described herein again.

Figure 16A:
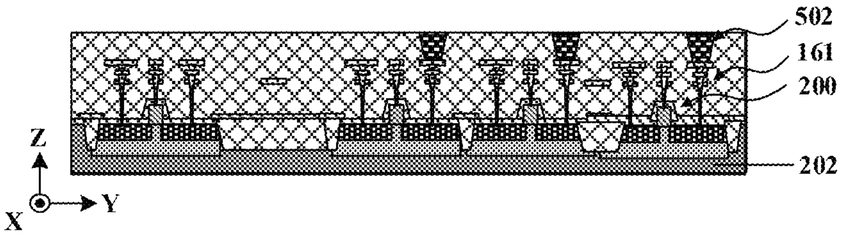
FIGS. 16A to 16D are schematic cross-sectional views II of a process of forming a memory device provided by examples of the present application.

Continuously referring to FIG. 16A, the third interconnect layer and the first bonding layer, which are stacked, are formed in sequence on the second semiconductor structure 200. In some examples, a third interconnect layer 161 may comprise one or more metal layers and contacts (a $3^{rd}$ level metal layer and a $3^{rd}$ level contact are shown in FIG. 16A) of the respective metal layers. The first bonding layer may comprise a first bonding contact 502.

In some examples, the manner of forming the third interconnect layer and the first bonding layer includes, but is not limited to, first utilizing the etching process to form the trench, and then utilizing the deposition process to form the metal layers, various contacts or bonding contacts.

Continuously referring to 16B, the second substrate 102 is provided, and the first semiconductor structure 100 is formed on the second substrate 102. Forming the first semiconductor structure 100 may comprise: forming the plurality of storage structures 159 on the second substrate 102; forming the semiconductor pillar 152 on a surface of each storage structure that is away from the surface of the second substrate, wherein the semiconductor pillar extends along the thickness direction of the second substrate and the Z direction; forming the plurality of word lines WL extending along the first direction (i.e., the X direction) on at least one side of the semiconductor pillar 152; and forming the bit line BL extending along the second direction (i.e., the Y direction) on the surface of the semiconductor pillar that is away from the storage structure.

In some examples, the storage structure 159 may be a capacitor. In some examples, the capacitor comprises a cup-shaped capacitor, a cylindrical capacitor, or a pillar-shaped capacitor. In some examples, the plurality of capacitors are arranged in a square shape or arranged in a hexagonal shape. A shape of the capacitor here may be understood with reference to a shape of the aforementioned capacitor; and the manner of forming the capacitor is relatively mature, and thus is no longer described herein again.

In some examples, the manner of forming the semiconductor pillar 152 and the word line WL may be understood with reference to the aforementioned descriptions in FIGS. 15D to 15F, and thus is not described herein again. It is to be noted that, the bit line here is formed on the surface of the semiconductor pillar 152 after the semiconductor pillar 152 is formed.

It is to be noted that, some other necessary manufacturing processes such as after forming the semiconductor pillar

152, doping two ends of the semiconductor pillar 152 that extend along the Z direction so as to form sources and drains are omitted herein. Based on this, the semiconductor pillar 152 is configured to form a transistor TA.

Figure 16B:
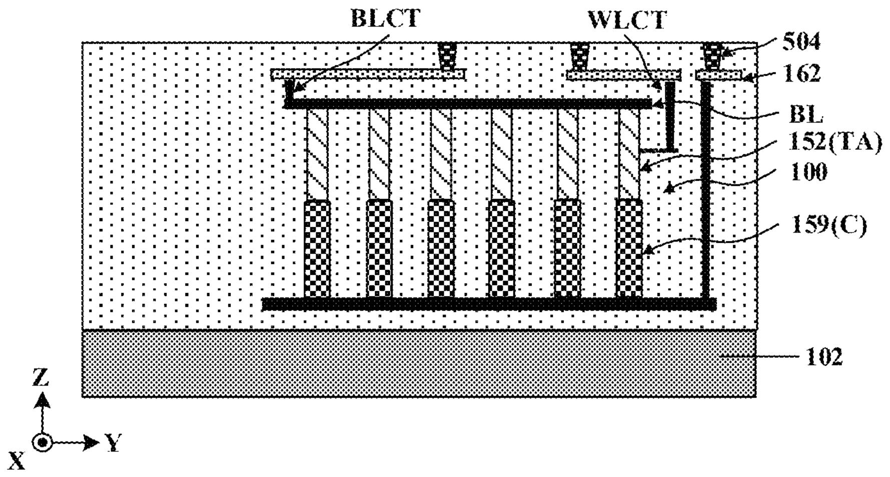

Continuously referring to FIG. 16B, the fourth interconnect layer 164 and the second bonding layer, which are stacked, are formed in sequence on the first semiconductor structure. In some examples, the fourth interconnect layer may comprise one or more interconnect layers (a 1st level metal layer and a 1st level contact are shown in FIG. 16B). The second bonding layer may comprise a second bonding contact 504.

In some examples, the manner of forming the fourth interconnect layer and the second bonding layer includes, but is not limited to, first utilizing the etching process to form the trench, and then utilizing the deposition process to form the metal layers, various contacts or bonding contacts.

It is to be noted that, the manufacturing process shown in FIG. 16A and the manufacturing process shown in FIG. 16B may be performed sequentially or performed at the same time, and a manufacturing sequence thereof is not limited in the examples of the present application.

Figure 16C:
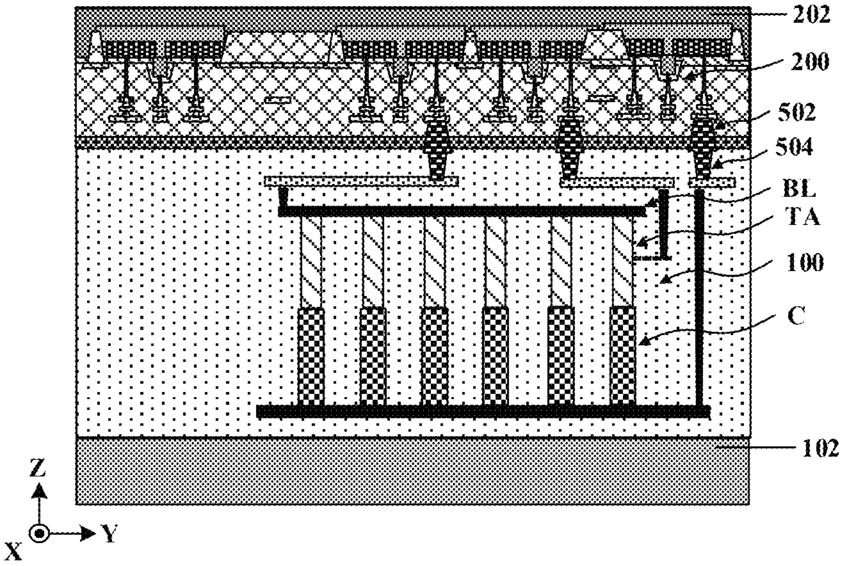

Referring to FIG. 16C, the first bonding layer and the second bonding layer are bonded, and a bonding manner includes, but is not limited to, hybrid bonding. The first semiconductor structure and the second semiconductor structure are electrically connected through the third interconnect layer, the first bonding layer, the second bonding layer, and the fourth interconnect layer.

Figure 16D:
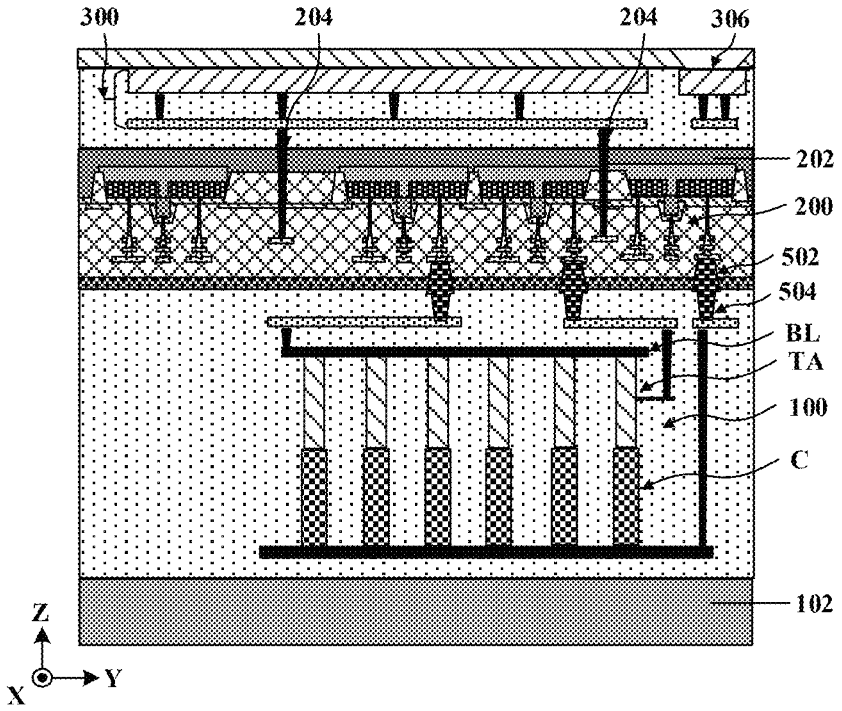

Referring to FIG. 16D, the front side of the first substrate 202 comprises a plurality of active regions spaced apart by isolation regions; and starting from the back side of the first substrate 202, connection structures 204 penetrating through the first substrate are formed at boundaries (which may be understood as edges of the active regions) of the active regions and in the isolation regions along the Z direction. Next, a first interconnect layer 300 is formed on the back side of the first substrate 202, and a routing layer configured to connect at least part of the peripheral circuit, and a power supply wire are formed in the first interconnect layer 300. A pad 306 electrically connected with the first interconnect layer is formed on a side of the first interconnect layer that is away from the second semiconductor structure. In some examples, the connection structure 204 may be completed by employing a through-silicon-via technology.

Herein, another manner of manufacturing the memory device is completed. In the manner, the first semiconductor structure and the second semiconductor structure are respectively grown and manufactured by employing different substrates, such that the problem of mutual restriction between a manufacturing process of the memory cell array and a manufacturing process of the peripheral circuit can be solved to shorten a development cycle of the memory device.

It is to be understood that "one example" and "an example" mentioned in the whole specification mean that particular features, structures or characteristics related to the example are included in at least one example of the present application. Therefore, "in one example" or "in an example" appearing at any place of the whole specification does not always refer to the same example. In addition, these particular features, structures or characteristics may be combined in one or more examples in any proper manner. It is to be understood that, in various examples of the present application, sequence numbers of the above processes do not indicate an execution sequence, and an execution sequence of various processes shall be determined by functionalities and intrinsic logics thereof, and shall constitute no limitation on an implementation process of the examples of the present application. The above sequence numbers of the examples of the present application are only for description, and do not represent advantages and disadvantages of the examples.

The above descriptions are merely preferred implementations of the present application, and not intended to limit the patent scope of the present application. Equivalent structure transformation made within using the contents of the specification and the drawings of the present application under the inventive concept of the present application, or direct/indirect application to other related technical fields are both encompassed within the patent protection scope of the present application.

What is claimed is:

1. A memory device, comprising:

a first semiconductor structure comprising a memory cell array;

a second semiconductor structure comprising a substrate, at least a plurality of first control circuits and at least part of a peripheral circuit distributed at gaps of the plurality of first control circuits, wherein the first semiconductor structure and the second semiconductor structure are stacked and connected, and wherein the substrate comprises a first side and a second side that are opposite to each other, and wherein the at least plurality of first control circuits and the at least part of a peripheral circuit are on the first side of the substrate;

a first interconnect layer located on the second side of the substrate of the second semiconductor structure that is away from the first semiconductor structure; and a plurality of connection structures penetrating through part of the second semiconductor structure, wherein one end of each connection structure is connected with the at least part of the peripheral circuit at the gaps, and the other end is connected with the first interconnect layer.

2. The memory device of claim 1, further comprising:

a second interconnect layer located between the first semiconductor structure and the second semiconductor structure, wherein the first semiconductor structure and the second semiconductor structure are connected through the second interconnect layer.

3. The memory device of claim 1, further comprising:

a third interconnect layer, a first bonding layer, a second bonding layer, and a fourth interconnect layer, which are located between the first semiconductor structure and the second semiconductor structure and stacked, wherein the first semiconductor structure and the second semiconductor structure are connected through the third interconnect layer, the first bonding layer, the second bonding layer, and the fourth interconnect layer.

4. The memory device of claim 1, wherein the memory cell array comprises a plurality of memory banks, and the memory bank comprises a plurality of memory blocks; one of the first control circuits is connected with one of the memory blocks, and the peripheral circuit is connected with all the memory banks; the at least part of the peripheral circuit comprises a plurality of first portions and one second portion;

a boundary of a region in which one of the first portions and the first control circuit correspondingly connected with one respective memory block are disposed overlaps with a boundary of a region in which the respective memory block is disposed; a boundary of a region in which the second portion is disposed overlaps with a boundary of a gap between the adjacent memory blocks; and at least one of the second portion or the plurality of first portions is connected with the first interconnect layer through the plurality of connection structures.

5. The memory device of claim 4, wherein the first control circuit comprises a sensing amplifier circuit and a word line driver circuit;

the sensing amplifier circuit is connected with a bit line in the memory block; and the word line driver circuit is connected with a word line in the memory block.

6. The memory device of claim 5, wherein the sensing amplifier circuit connected with the memory block is disposed in a first region and a second region; the word line driver circuit connected with the memory block is disposed in a third region and a fourth region; and the first region and the second region both extend along a first direction and are staggered along a second direction, the third region and the fourth region both extend along the second direction and are staggered along the first direction, the first direction is perpendicular to a direction in which the bit line extends, and the second direction is perpendicular to a direction in which the word line extends.

7. The memory device of claim 6, wherein a boundary of the first region is in contact with a boundary of the third region, and a boundary of the second region is in contact with a boundary of the fourth region; and a sum of sizes of the boundary of the first region and the boundary of the third region along the first direction is a first size, a size, along the first direction, of the boundary of the region in which the memory block is disposed is a second size, and the first size is less than the second size.

8. The memory device of claim 5, wherein the first semiconductor structure further comprises a first contact connected with the word line and a second contact connected with the bit line; the first contact and the second contact are both disposed on a side close to the second semiconductor structure;

the second semiconductor structure further comprises a third contact connected with the sensing amplifier circuit and a fourth contact connected with the word line driver circuit; the third contact and the fourth contact are both disposed on a side close to the first semiconductor structure; and the second contact and the third contact, and the first contact and the fourth contact are both connected at least through the interconnect layer located between the first semiconductor structure and the second semiconductor structure.

9. The memory device of claim 1, wherein the second semiconductor structure comprises a plurality of active regions spaced apart by isolation regions; and the connection structures are disposed at boundaries of the active regions and in the isolation regions.

10. The memory device of any one of claim 1, further comprising a power supply wire, wherein the power supply wire is disposed in the first interconnect layer.

11. The memory device of claim 5, wherein the second semiconductor structure further comprises a plurality of second control circuits; one of the second control circuits is connected with one of the memory banks; the second control circuits are distributed in gaps of the plurality of first control circuits; and the second control circuit comprises a row decoding circuit and a column decoding circuit.

12. The memory device of claim 11, wherein a boundary of a region in which the second control circuit is disposed overlaps with a boundary of a gap between the adjacent memory banks.

13. The memory device of claim 1, further comprising a pad, wherein the pad is located on a side of the first interconnect layer that is away from the second semiconductor structure, and is electrically connected with the first interconnect layer.

14. The memory device of claim 1, wherein the memory cell array comprises:

a plurality of word lines extending along a first direction;

a plurality of bit lines extending along a second direction; and a plurality of semiconductor pillars arranged in an array, and a storage structure corresponding to each of the plurality of semiconductor pillars, wherein the semiconductor pillar and the corresponding storage structure are stacked;

wherein the semiconductor pillar extends along a third direction, and is provided with a first end and a second end oppositely arranged in the third direction; the first end is connected with the bit line, and the second end is connected with the storage structure; the word line is coupled with at least one side of the semiconductor pillar; and the third direction is perpendicular to both the first direction and the second direction.

15. A memory device, comprising:

a first semiconductor structure comprising a memory cell array;

a second semiconductor structure comprising a substrate, at least a plurality of first control circuits and at least part of a peripheral circuit distributed at gaps of the plurality of first control circuits, and wherein the substrate comprises a first side and a second side that are opposite to each other, and wherein the at least plurality of first control circuits and the at least part of a peripheral circuit are on the first side of the substrate;

a first interconnect layer located on the second side of the substrate of the second semiconductor structure that is away from the first semiconductor structure;

a plurality of connection structures penetrating through part of the second semiconductor structure, wherein one end of each connection structure is connected with the at least part of the peripheral circuit at the gaps, and the other end is connected with the first interconnect layer; and a second interconnect layer located between the first semiconductor structure and the second semiconductor structure, and connected with both the memory cell array and the first control circuit.

16. The memory device of claim 15, wherein the memory cell array comprises a plurality of memory banks, and the memory bank comprises a plurality of memory blocks; one of the first control circuits is connected with one of the memory blocks, and the peripheral circuit is connected with all the memory banks; the at least part of the peripheral circuit comprises a plurality of first portions and one second portion;

a boundary of a region in which one of the first portions and the first control circuit connected with one respective memory block are disposed overlaps with a boundary of a region in which the respective memory block is disposed; a boundary of a region in which the second portion is disposed overlaps with a boundary of a gap between the adjacent memory blocks; and at least one of the second portion or the plurality of first portions is connected with the first interconnect layer through the plurality of connection structures.

17. The memory device of claim 15, further comprising a power supply wire, wherein the power supply wire is disposed in the first interconnect layer.

18. A memory device, comprising:

a first semiconductor structure comprising a memory cell array;

a second semiconductor structure comprising a substrate, at least a plurality of first control circuits and at least part of a peripheral circuit distributed at gaps of the plurality of first control circuits, and wherein the substrate comprises a first side and a second side that are opposite to each other, and wherein the at least plurality of first control circuits and the at least part of a peripheral circuit are on the first side of the substrate;

a first interconnect layer located on the second side of the substrate of the second semiconductor structure that is away from the first semiconductor structure; and a second interconnect layer, a first bonding layer, a second bonding layer, and a fourth interconnect layer, which are stacked, located between the first semiconductor structure and the second semiconductor structure, and all connected with the memory cell array and the first control circuit.

19. The memory device of claim 18, wherein the memory cell array comprises a plurality of memory banks, and the memory bank comprises a plurality of memory blocks; one of the first control circuits is connected with one of the memory blocks, and the peripheral circuit is connected with all the memory banks; the at least part of the peripheral circuit comprises a plurality of first portions and one second portion;

a boundary of a region in which one of the first portions and the first control circuit connected with one respective memory block are disposed overlaps with a boundary of a region in which the respective memory block is disposed; a boundary of a region in which the second portion is disposed overlaps with a boundary of a gap between the adjacent memory blocks; and at least one of the second portion or the plurality of first portions is connected with the first interconnect layer through the plurality of connection structures.

20. The memory device of claim 18, further comprising a power supply wire, wherein the power supply wire is disposed in the first interconnect layer.

* * * * *